United States Patent
Birmiwal et al.

(10) Patent No.: US 7,386,775 B2
(45) Date of Patent: Jun. 10, 2008

(54) SCAN VERIFICATION FOR A SCAN-CHAIN DEVICE UNDER TEST

(75) Inventors: Parag Birmiwal, Austin, TX (US); Tilman Gloekler, Gaertringen (DE); Klaus Heinzelmann, Leinfelden-Echterdingen (DE); Johannes Koesters, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 527 days.

(21) Appl. No.: 11/206,846

(22) Filed: Aug. 18, 2005

(65) Prior Publication Data

US 2007/0061644 A1    Mar. 15, 2007

(51) Int. Cl.
*G01R 31/28* (2006.01)
*G06F 11/00* (2006.01)

(52) U.S. Cl. .................................. 714/729; 714/736

(58) Field of Classification Search ................ None
See application file for complete search history.

(56) References Cited

U.S. PATENT DOCUMENTS

| | | | |
|---|---|---|---|
| 5,642,362 A * | 6/1997 | Savir | 714/726 |
| 6,748,564 B1 * | 6/2004 | Cullen et al. | 714/729 |
| 6,920,582 B2 * | 7/2005 | Alt et al. | 714/30 |
| 7,080,300 B1 * | 7/2006 | Herron et al. | 714/726 |

* cited by examiner

*Primary Examiner*—Christine T Tu
(74) *Attorney, Agent, or Firm*—Biggers & Ohanian, LLP

(57) ABSTRACT

Methods, apparatus, and products are disclosed for scan verification for a simulated device under test ('DUT'), the DUT having scan chains, scan inputs, and scan outputs that include verifying correct data entry from the scan inputs of the DUT into the beginning of the scan chain, verifying correct propagation of scan data in the scan chain between the scan inputs and the scan outputs, verifying correct data output from the end of the scan chain to the scan outputs, and leak testing the scan chain with undetermined states for scan cells in the scan chain.

17 Claims, 12 Drawing Sheets

SCAN VERIFICATION FOR A SCAN-CHAIN DEVICE UNDER TEST

BACKGROUND OF THE INVENTION

1. Field of the Invention

The field of the invention is data processing, or, more specifically, methods, apparatus, and products for scan verification for a device under test ('DUT').

2. Description of Related Art

In developing digital integrated circuits, it is desirable to test the design of a digital integrated circuit before manufacturing. The evaluation of the reliability and quality of a digital integrated circuit is commonly called "testing", yet it is comprised of distinct phases. Functional verification is the initial phase in which designs are "tested" to ensure that they match their functional specification, that is, to verify the correctness of the design. Verification checks that all design rules are adhered to, from layout to electrical parameters; more generally, this type of functional testing checks that the circuit: (a) implements what it is supposed to do and (b) does not do what it is not supposed to do. This type of evaluation is done at the design stage and uses a variety of techniques, including logic verification with the use of hardware description languages, full functional simulation, and generation of functional test patterns.

Manufacturing testing correctly refers to the phase when one must ensure that only defect-free production chips are packaged and shipped, during which faults arising from manufacturing and/or wear-out are detected. One of the initial testing methods involved using patterns to provide instructions to the device input pins and to predict the states of the output pins. However, the density of circuitry continues to increase, while the number of I/O pins remains small. This causes a serious escalation of complexity, and testing is becoming one of the major costs to industry.

Most testing techniques are designed to be applied to combinatorial circuits only. While this may appear a strong restriction, in practice it is a realistic assumption based on the idea of designing a sequential circuit by partitioning the memory elements from the control functionality, such that the circuit can be reconfigured as combinatorial at testing time. This general approach is one of the methods in design for testability ('DFT'). DFT encompasses any design strategy aimed at enhancing the testability of a circuit. In particular, scan design is the best known implementation for separating the latches from the combinational gates, such that some of the latches can also be reconfigured and used as either tester units or as input generator units. Scan design effectively converts sequential logic design into combinatorial logic design by connecting the elements of the circuit to shift registers. Scanning makes it possible to assure the detection of all faults in the manufactured circuit, reduce testing design time and costs, and reduce the execution time of performing tests on fabricated chips.

Scan design aims to achieve total or near total controllability and observability in sequential circuits. In this approach engineers design the elements in the scan chain (flip-flops, latches, or both) to operate either in normal mode or serial (test) mode. In the normal, or system, mode, the elements are configured for parallel operation. In test mode, the elements are loaded (controlled) by scanning in the desired data. In a similar fashion, engineers observe the data present in the elements by scanning out their contents in the serial test mode. Scan design also aids the initial bringup of the DUT in the lab using JTAG. During the debug process in the lab, if needed, scan chains aid in reconfiguring the flip-flops and latches to different values and for running tests on the DUT.

Scanning is carried out by serially injecting signals into the scan chain through device pins by enabling the scan mode on the elements in the scan chain and clocking data in thereby shifting the serial shift register and forcing data in the last elements of the scan chain to output. The phrases "scanning in" and "scanning out" emphasize different aspects of the same process. Scanning in data always entails scanning out data and vice versa.

Because scanning is such a useful process, it is important that it functions properly. Often, design of scan chains must be performed manually, which is error-prone. Thus, the design of the scanning process is verified during the initial stages of testing. The initial stages of testing, known as verification, may encompass several steps. In one of these steps, the scan verification is accomplished by simulating the device under test ('DUT') in a simulation and performing simulated scan operations for each scan chain. In the past, these simulated scan operations were performed by scanning in a test pattern through the entire scan chain, scanning out the contents of the scan chain, and verifying the correctness of the outputs for a given test pattern. A typical scan chain may contain 15-20,000 elements and perhaps as many as 90,000 elements. Each DUT may contain many scan chains. Although this method is thorough, simulating the scan operation in this manner can take hours. Furthermore, the important property that while scanning the scan chains other parts of the processor remain unchanged can be addressed by formal verification, which causes significant runtime drawbacks due to state explosion, or by checking all the latches surrounding the scan chain after each simulator cycle, which is also time-consuming.

SUMMARY OF THE INVENTION

Methods, apparatus, and products are disclosed for scan verification for a simulated device under test ('DUT') that include verifying correct data entry from the scan inputs of the DUT into the beginning of the scan chain; verifying correct propagation of scan data in the scan chain between the scan inputs and the scan outputs; verifying correct data output from the end of the scan chain to the scan outputs; and leak testing the scan chain with undetermined states for scan cells in the scan chain. The DUT may have scan chains, scan inputs, and scan outputs.

Verifying correct data entry from the scan inputs of the DUT into the beginning of the scan chain may include identifying expected values of the beginning of a scan chain for a test pattern, scanning the test pattern through the scan inputs into the beginning of the scan chain, and comparing the expected values with the contents of the beginning of the scan chain after scanning in the test pattern. The test pattern may be made up of a binary value for each scan cell in the beginning of the scan chain.

Verifying correct propagation of scan data in the scan chain between the scan inputs and the scan outputs may include transforming, in dependence upon locations of inverters in the scan chain, a binary test pattern; loading the transformed test pattern into the scan chain; scanning into the scan chain one or more binary values; and after scanning in the binary values, comparing values in the scan chain with the transformed test pattern. The test pattern may be made up of a binary value for each scan cell in the beginning of the scan chain.

Verifying correct data output from the end of the scan chain to the scan outputs may include identifying expected values of the output of a scan chain for a test pattern; loading the test pattern directly into the end of the scan chain, scanning the test pattern from the end of the scan chain through the scan outputs, and comparing actual data values from the scan outputs with the expected values. The test pattern may be made up of a binary value for each scan cell in the beginning of the scan chain.

Leak testing the scan chain with undetermined states for scan cells in the scan chain includes initializing to 1 or 0 all initializable components of the DUT including the scan chains, except for one scan chain under test; loading the entire scan chain under test with the marker value; scanning into the beginning of the scan chain a multiplicity of instances of the marker value; and determining whether instances of the marker value are propagated to components of the DUT outside the scan chain under test. State values of the simulator may include a propagatable marker value.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
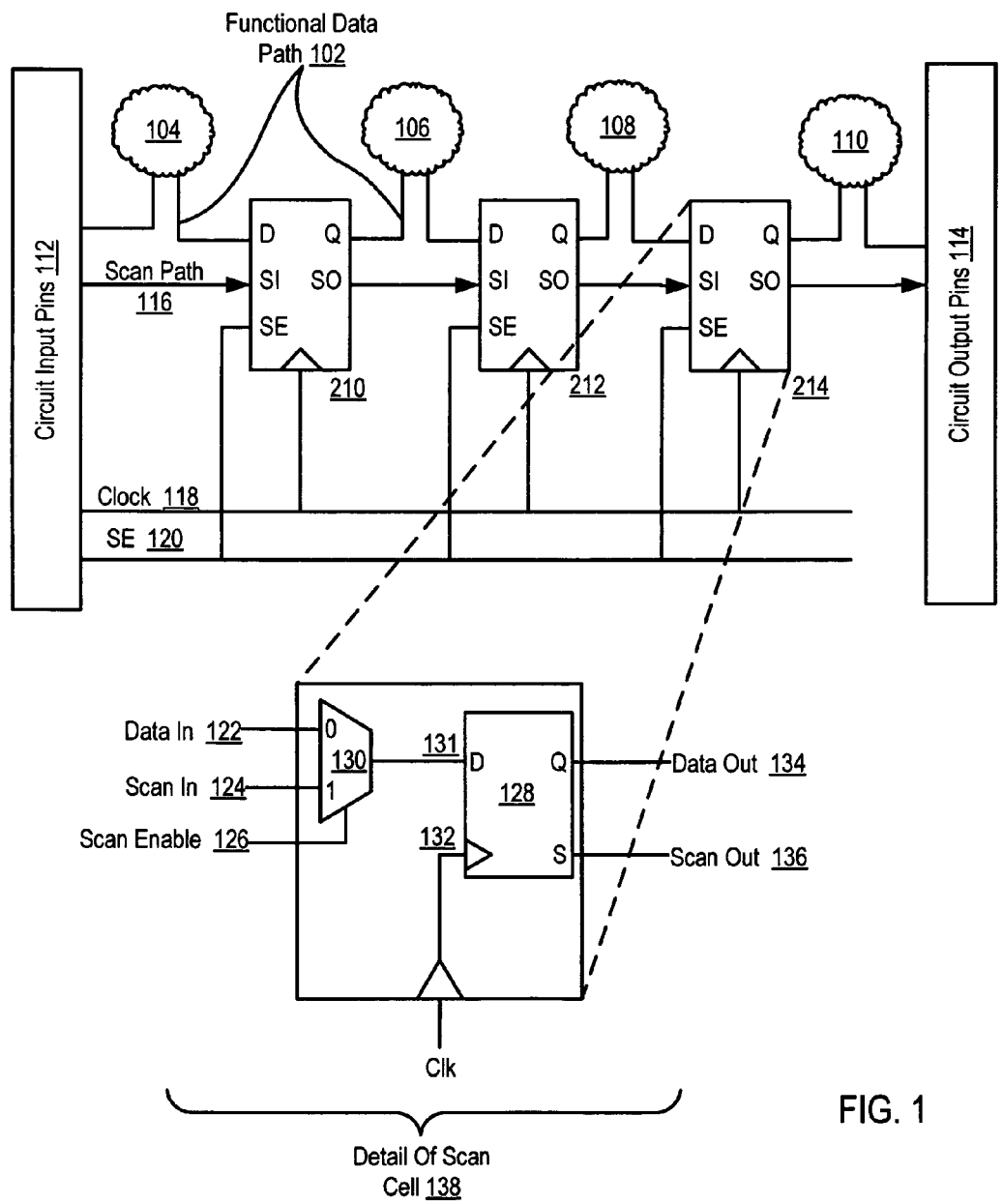
FIG. 1 sets forth a network diagram illustrating an exemplary system for scan verification for a DUT according to embodiments of the present invention.

Exemplary methods, apparatus, and products for scan verification for a DUT according to embodiments of the present invention are described with reference to the accompanying drawings, beginning with FIG. 1. FIG. 1 sets forth a network diagram illustrating an exemplary system for scan verification for a device under test ('DUT') according to embodiments of the present invention. The system of FIG. 1 operates generally to verify scans for a DUT according to embodiments of the present invention by verifying correct data entry from the scan inputs of the DUT into the beginning of the scan chain, verifying correct propagation of scan data in the scan chain between the scan inputs and the scan outputs, verifying correct data output from the end of the scan chain to the scan outputs, and leak testing the scan chain with undetermined states for scan cells in the scan chain.

The system of FIG. 1 includes scan cells (210, 212, 214), circuit input pins (112), circuit output pins (114), a functional data path (102), a scan path (116), a clock line (118), and a scan enable line (120). In the system of FIG. 1, scan cells (210, 212, 214) are multi-purpose memory elements, such as, for example, latches or flip-flops, which may operate in normal (functional) mode or test (scan) mode. A scan cell may be implemented as a demultiplexed memory element. FIG. 1 includes a detailed depiction of a scan cell (138) implemented as a demultiplexed memory element. In the detailed depiction, a scan cell is implemented with a two-input demultiplexer (130) and a memory element (128). The memory element is shown here as a data D flip-flop but may also be implemented as a latch or a JK flip-flop or some other memory element as will occur to those of skill in the art. When the demultiplexer's scan enable line (126) is inactive, functional data on the data input line (122) is passed to the data input (131) of flip-flop (128), and, on an active edge of the clock input (132), the functional data is placed on the data output (134) of the scan cell. When the demultiplexer's scan enable line (126) is active, scan data on the scan input (124) is passed to the data input (131) of flip-flop (128), and, on the active edge of the clock input (132), the scan data is placed on the scan output (136) of the scan cell (138).

As an alternative to implementing a scan cell as a demultiplexed memory element, a scan cell may be implemented with a level-sensitive scan design ('LSSD') (not shown). LSSD uses separate system and scan clocks to distinguish functional mode and scan mode as well as two latches which form a master/slave pair. In addition to implementing scan cells as demultiplexed memory elements or with LSSD, other ways of implementing scan cells will occur to those of skill in the art, and all such ways are well within the scope of the present invention.

The scan cells (210, 212, 214) are configured in effect as a kind of a long serial shift register, or 'scan chain,' with one end of the scan chain connected to scan inputs and the other end of the scan chain connected to scan outputs. The scan cell connected most directly to the scan input is generally referred to as the first scan cell (210), and the scan cell connected most directly to the scan output is generally referred to as the last scan cell (214).

A relatively small number of scan cells nearest the scan input is referred to as the 'beginning of the scan chain.' The beginning of the scan chain is said to be 'relatively small' because in scan chains that may comprise thousands of scan cells, typical sizes of the beginning of the scan chain may be 32 scan cells or 64 scan cells, for example. Similarly, a relatively small number of scan cells nearest the scan output is referred to as the 'end of the scan chain.' The end of the scan chain also is said to be 'relatively small' because in scan chains that may comprise thousands of scan cells, typical sizes of the end of the scan chain may be 32 scan cells or 64 scan cells, for example.

In the system of FIG. 1, a scan input is the component of the DUT which provides test input to the scan chain for scanning. An exemplary scan input of the system of FIG. 1 would include, for example, a circuit input pin (112) of the DUT connected, directly or indirectly, outside of the DUT to tester equipment (not shown) and inside of the DUT to the first scan cell (210) of the scan chain. In the system of FIG. 1, a scan output is the component of the DUT which receives test output from the scan chain after scanning. An exemplary scan output of the system of FIG. 1 would include, for example, a circuit output pin (114) of the DUT connected, directly or indirectly, outside of the DUT to tester equipment (not shown) and inside the DUT to the last scan cell (214) of the scan chain. Additional circuitry (not shown in FIG. 1) may be inserted between scan inputs and the first scan cell in a scan chain, and additional circuitry also may exist between the last scan cell and the last scan cell in a scan chain.

In the system of FIG. 1, during normal operation of the DUT, scan cells (210, 212, 214) operate in functional mode. In the example of FIG. 1, the state of the scan enable line (120) represents the mode of the scan chain, either 'scan mode' or 'functional mode.' While in functional mode, the scan cells (210, 212, 214) operate as memory elements, such as, for example, latches or flip-flops, for the DUT. Changes in the values of the scan cells (210, 212, 214) occur as the result of the normal operation of the DUT. During normal operation of the DUT, only the functional data path (102) is active. Signals are placed on the functional data path (102) from the circuit input pins (112), where the signals interact with combinatorial logic or sequential logic (104, 106, 108, 110) in order to carry out the normal function of the DUT and transmit output to the circuit output pins (114).

In scan mode, the scan cells (210, 212, 214) operate as registers in a serial shift register chain, called a 'scan chain.' In scan mode, changes in the values of the scan cells (210, 212, 214) occur as the result of the scan operation of the DUT. In the example of FIG. 1, in scan mode, only the scan path (116) is intended to be active. Signals are placed on the scan path (116) from one of the circuit input pins (112). The signals introduce data to the scan chain by shifting a value into the first scan cell of the scan chain with each clock pulse from the clock line (118). With each clock pulse, the scanning operation shifts the data in each scan cell by transmitting through each scan cell's scan out line ('SO') the current value of the scan cell, which is received by the next scan cell through its scan in line ('SI'). In this manner, in the system of FIG. 1, with each clock pulse, the data in the first scan cell (210) shifts to the second scan cell, the data previously in the second scan cell shifts to the next scan cell, and so on until the data reaches the last scan cell (214). As data is shifted into the last scan cell (214), the data previously in the last scan cell is output to the scan output.

The arrangement of inputs, outputs, control lines, clocks, memory elements, combinatorial logic, multiplexers, and other circuit elements making up the exemplary system illustrated in FIG. 1 are for explanation, not for limitation. Systems useful for scan verification for a DUT according to various embodiments of the present invention may include additional gates, latches, flip-flops, and other circuit elements, as well as alternate configurations, not shown in FIG. 1, as will occur to those of skill in the art.

Figure 2:
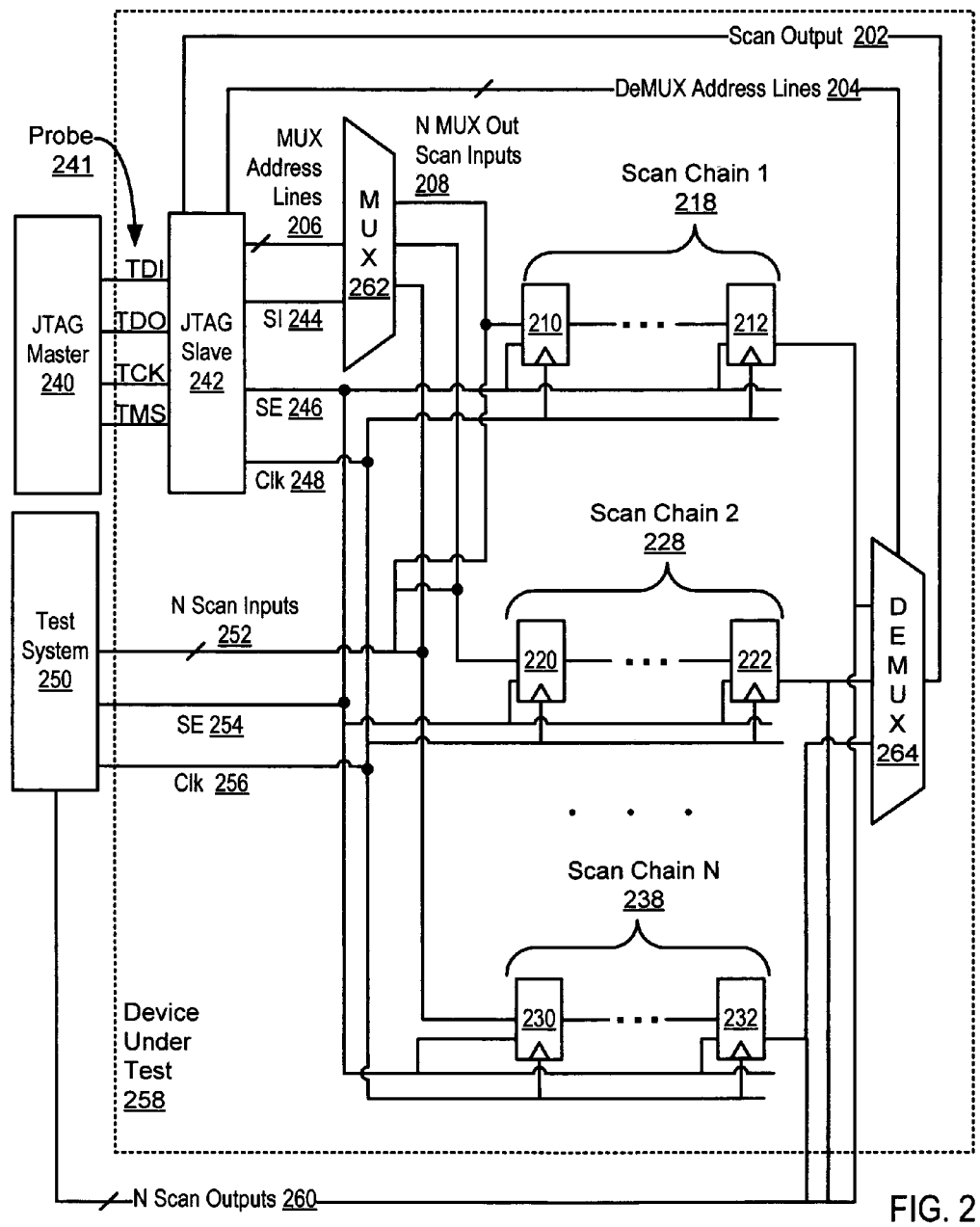
FIG. 2 sets forth a network diagram illustrating an exemplary system for scan verification for a DUT according to embodiments of the present invention.

For further explanation, FIG. 2 sets forth a network diagram illustrating a further exemplary system for scan verification for a device under test ('DUT') (258) according to embodiments of the present invention. The system of FIG. 2 operates generally to verify scan operation for a DUT (258) according to embodiments of the present invention by verifying correct data entry from the scan inputs of the DUT (258) into the beginning of the scan chain, verifying correct propagation of scan data in the scan chain between the scan inputs and the scan outputs, verifying correct data output from the end of the scan chain to the scan outputs, and leak testing the scan chain with undetermined states for scan cells in the scan chain. By comparison with the example of FIG. 1, the example of FIG. 2 contains more detail regarding inputs and outputs to and from scan chains.

The system of FIG. 2 includes three scan chains (218, 228, 238) made up respectively of scan cells (210-212, 220-222, 230-232). As mentioned above, a scan chain is a serially configured multiplicity of scan cells in which are stored chip state data. The scan cells are configured into serial shift register chains, or 'scan chains,' with one end of each scan chain connected to scan inputs and the other end of each scan chain connected to scan outputs. The three scan chains of FIG. 2 represent for purposes of explanation a large number of scan chains typically present in DUTs according to embodiments of the present invention. Similarly, each scan chain is typically composed of a larger number of scan cells. The arrangement of FIG. 2 is chosen for convenience of explanation, not as a limitation of the present invention. Each scan chain in the example of FIG. 2 is coupled to a scan enable line (246) and to a clock line (248).

The system of FIG. 2 has two subsystems for scan data input and output: a serial JTAG module (240, 242) and a parallel test system (250). 'JTAG' stands for 'Joint Test Action Group,' the common name for the IEEE 1149.1 standard for Test Access Port and Boundary Scan, primarily used for testing integrated circuits but also useful as a mechanism for debugging embedded systems. The JTAG module is composed of a JTAG master module (240) located off the DUT and a JTAG slave module (242) located on the DUT and therefore simulated in HDL.

The JTAG master module (240) and the JTAG slave module (242) communicate through a four-line probe (241) whose lines include a TDI line (Test Data In), a TDO line (Test Data Out), a TCK line (Test Clock), and a TMS line (Test Mode Select). JTAG probe lines may also include an optional TRST line (Test Reset). In this example, the JTAG interface is added to the DUT, designed so that multiple scan chains can have their scan input lines daisy-chained together, and a test probe need only connect to a single 'JTAG port' to have access to all scan chains on a DUT.

Because the JTAG interface includes only the one data line for input (TDI) and only one data line for output (TDO), the JTAG protocol is necessarily serial. The example of FIG. 2 therefore provides a multiplexer (262) driven by a set of address lines (206) so that each scan chain may be addressed separately by the JTAG module. The JTAG scan input line (244) is therefore multiplexed among the scan chains, one scan chain at a time.

Scan output data in the system of FIG. 2 is demultiplexed (264) from the outputs of the scan chains (218, 228-238) to the single scan output line (202) that returns scan output data to the JTAG module. Demultiplexer address lines (204) between the JTAG module and the demultiplexer (264) select the scan chain whose scan output is returned for any particular test run.

In addition to the JTAG module for single-line serial input, the system of FIG. 2 has a subsystem, test system (250), for simultaneous parallel input to multiple scan chains. The JTAG module provides one scan input line (244) that is multiplexed (262) to one of N multiplexed scan input lines (208), where N is the number of scan chains. In contrast, test system (250), which is a computerized signal source for scan data, provides the capability of driving scan data simultaneously onto N scan inputs (252) composed of one scan input line for each scan chain. Test system (250) also provides N inputs for N return lines for scan outputs (260), one for each scan chain in the system of FIG. 2, providing also the capability of processing output from all scan chains simultaneously as well. Both the JTAG module (242) and test system (250) drive scan enable lines (254) connected to all scan cells as well as scan clock signals (256) connected to all scan cells in the system of FIG. 2.

The arrangement of scan cells, multiplexers, demultiplexers, test equipment, JTAG hardware, and other circuit elements making up the exemplary system illustrated in FIG. 2 are for explanation, not for limitation. Systems useful according to various embodiments of the present invention may include additional gates, latches, flip-flops, registers, multiplexing devices, and other circuit elements, as well as alternate configurations, not shown in FIG. 2, as will occur to those of skill in the art.

Scan verification for a DUT in accordance with the present invention is generally implemented with computers, that is, with automated computing machinery. In the system of FIG. 2, for example, all circuit elements, inputs, and outputs of the DUT are implemented to some extent at least as a simulation carried out on computers. For further explanation, therefore, FIG. 3 sets forth a block diagram of automated computing machinery comprising an exemplary computer (152) useful in scan verification for a DUT according to embodiments of the present invention. The computer (152) of FIG. 3 includes at least one computer processor (156) or 'CPU' as well as random access memory (168) ('RAM') which is connected through a system bus (160) to processor (156) and to other components of the computer.

Stored in RAM (168) is a simulator (150), computer program instructions for simulating a circuit by modeling the circuit's structure and behavior in a simulation. Also stored in RAM (168) is a device under test ('DUT') (162), computer program instructions, typically in a Hardware Description Language or 'HDL,' for representing in a simulation a device designed for eventual manufacture. Also stored in RAM (168) are one or more scan chains (164), components of the DUT, also expressed in an HDL.

Also stored in RAM (168) is an operating system (154). Operating systems useful in computers according to embodiments of the present invention include UNIX™, Linux™, Microsoft NT™, AIX™, IBM's i5/OS™, and others as will occur to those of skill in the art. Operating system (154), simulator (150), DUT (162), and scan chain (164) in the example of FIG. 3 are shown in RAM (168), but many components of such software typically are stored in non-volatile memory (166) also.

Figure 3:
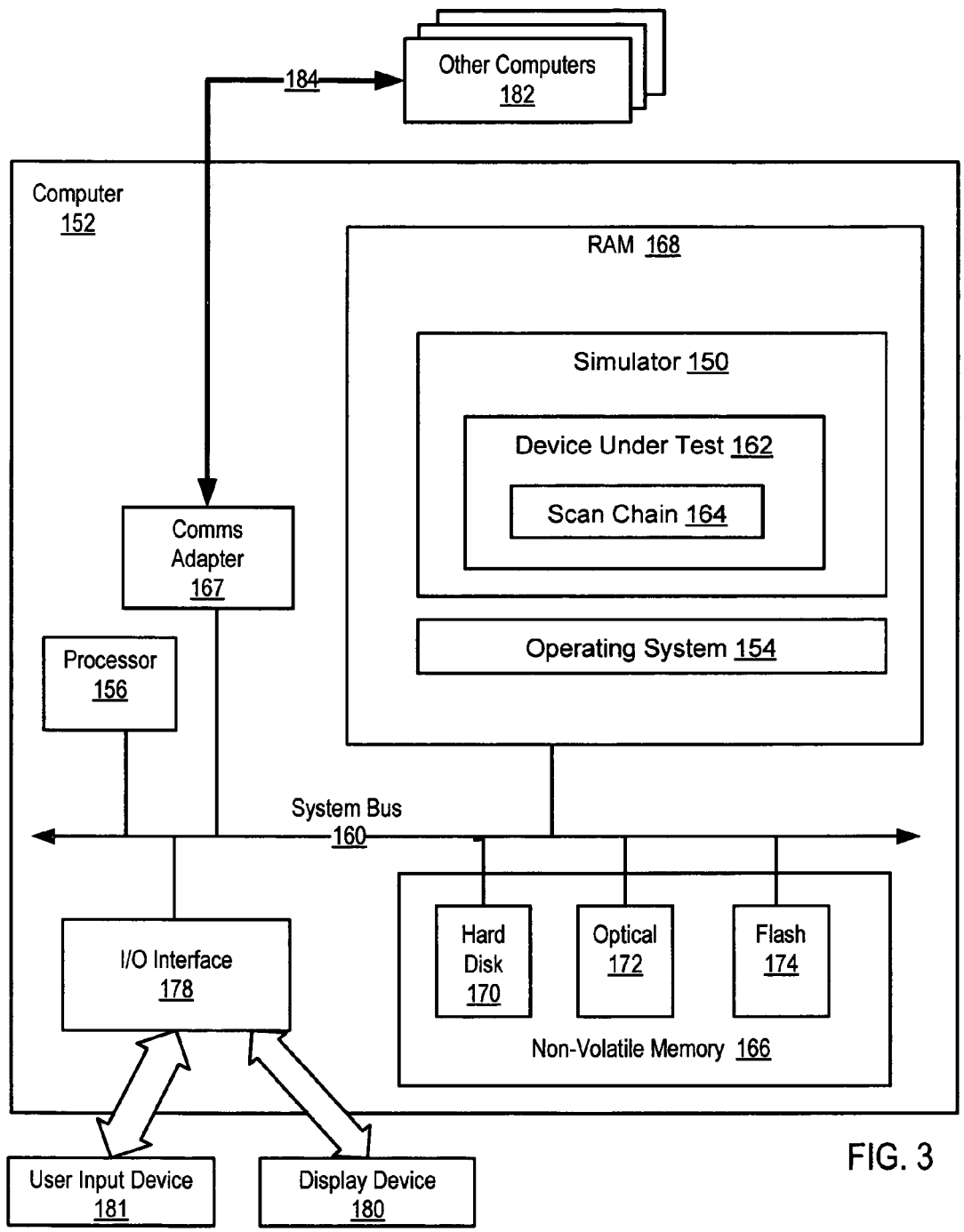
FIG. 3 sets forth a block diagram of automated computing machinery comprising an exemplary computer useful in scan verification for a DUT according to embodiments of the present invention.

Computer (152) of FIG. 3 includes non-volatile computer memory (166) coupled through a system bus (160) to processor (156) and to other components of the computer (152). Non-volatile computer memory (166) may be implemented as a hard disk drive (170), optical disk drive (172), electrically erasable programmable read-only memory space (so-called 'EEPROM' or 'Flash' memory) (174), RAM drives (not shown), or as any other kind of computer memory as will occur to those of skill in the art.

The example computer of FIG. 3 includes one or more input/output interface adapters (178). Input/output interface adapters in computers implement user-oriented input/output through, for example, software drivers and computer hardware for controlling output to display devices (180) such as computer display screens, as well as user input from user input devices (181) such as keyboards and mice.

The exemplary computer (152) of FIG. 3 includes a communications adapter (167) for implementing data communications (184) with other computers (182). Such data communications may be carried out serially through RS-232 connections, through external buses such as USB, through data communications networks such as IP networks, and in other ways as will occur to those of skill in the art. Communications adapters implement the hardware level of data communications through which one computer sends data communications to another computer, directly or through a network. Examples of communications adapters useful for determining availability of a destination according to embodiments of the present invention include modems for wired dial-up communications, Ethernet (IEEE 802.3) adapters for wired network communications, and 802.11b adapters for wireless network communications.

An Example Method for Scan Verification for a DUT

Figure 4:
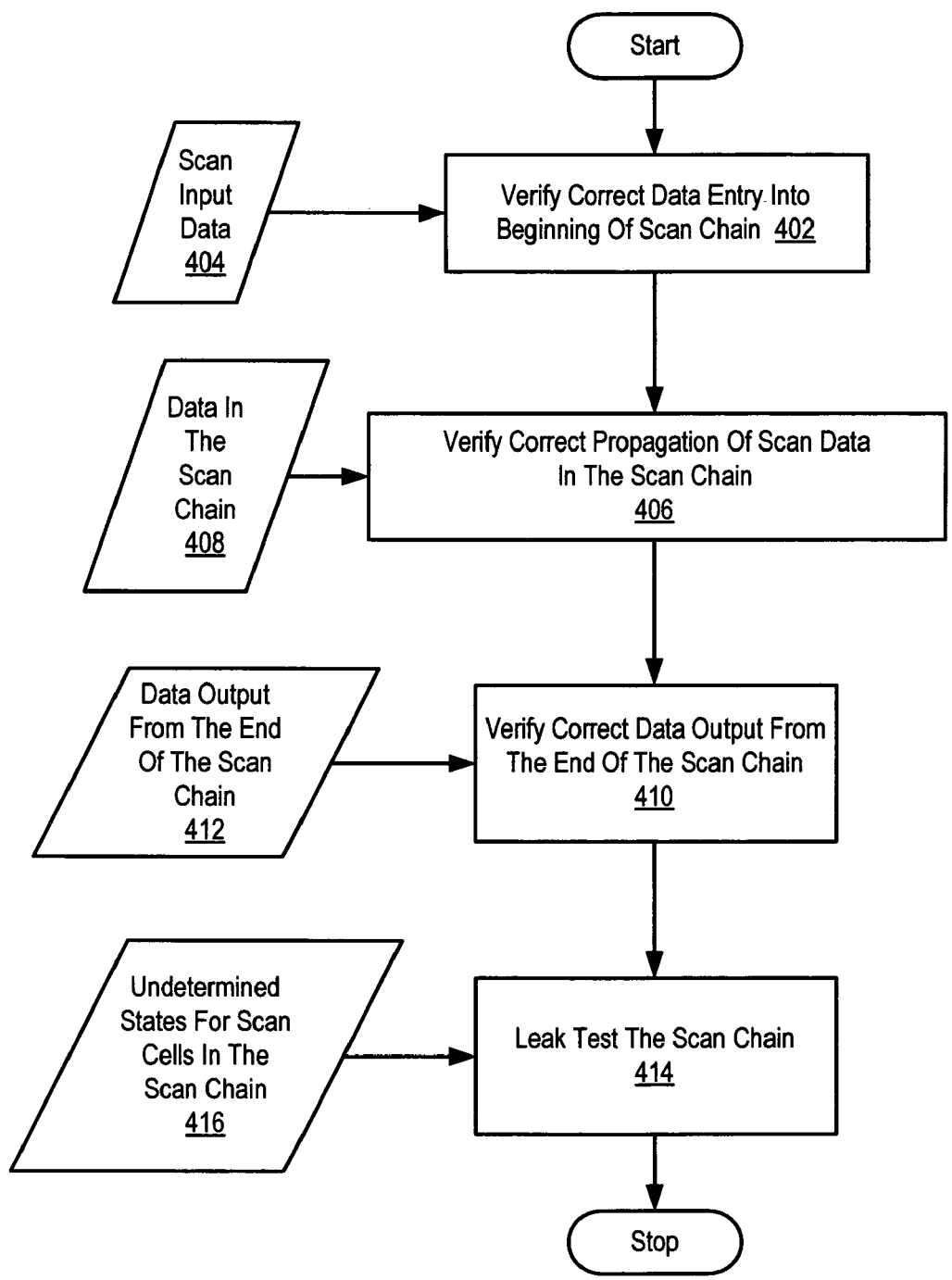
FIG. 4 sets forth a flow chart illustrating an exemplary method for scan verification for a DUT according to embodiments of the present invention.

For further explanation, FIG. 4 sets forth a flow chart illustrating an exemplary method for scan verification for a DUT according to embodiments of the present invention that includes verifying (402) correct data entry from the scan inputs of the DUT into the beginning of the scan chain; verifying (406) correct propagation of scan data (404) in the scan chain between the scan inputs and the scan outputs; verifying (410) correct data output from the end of the scan chain to the scan outputs; and leak testing (414) the scan chain with undetermined states for scan cells in the scan chain. The method of FIG. 4 is further explained with reference to FIGS. 5-12, beginning with FIG. 5.

The Beginning of a Scan Chain

Figure 5:
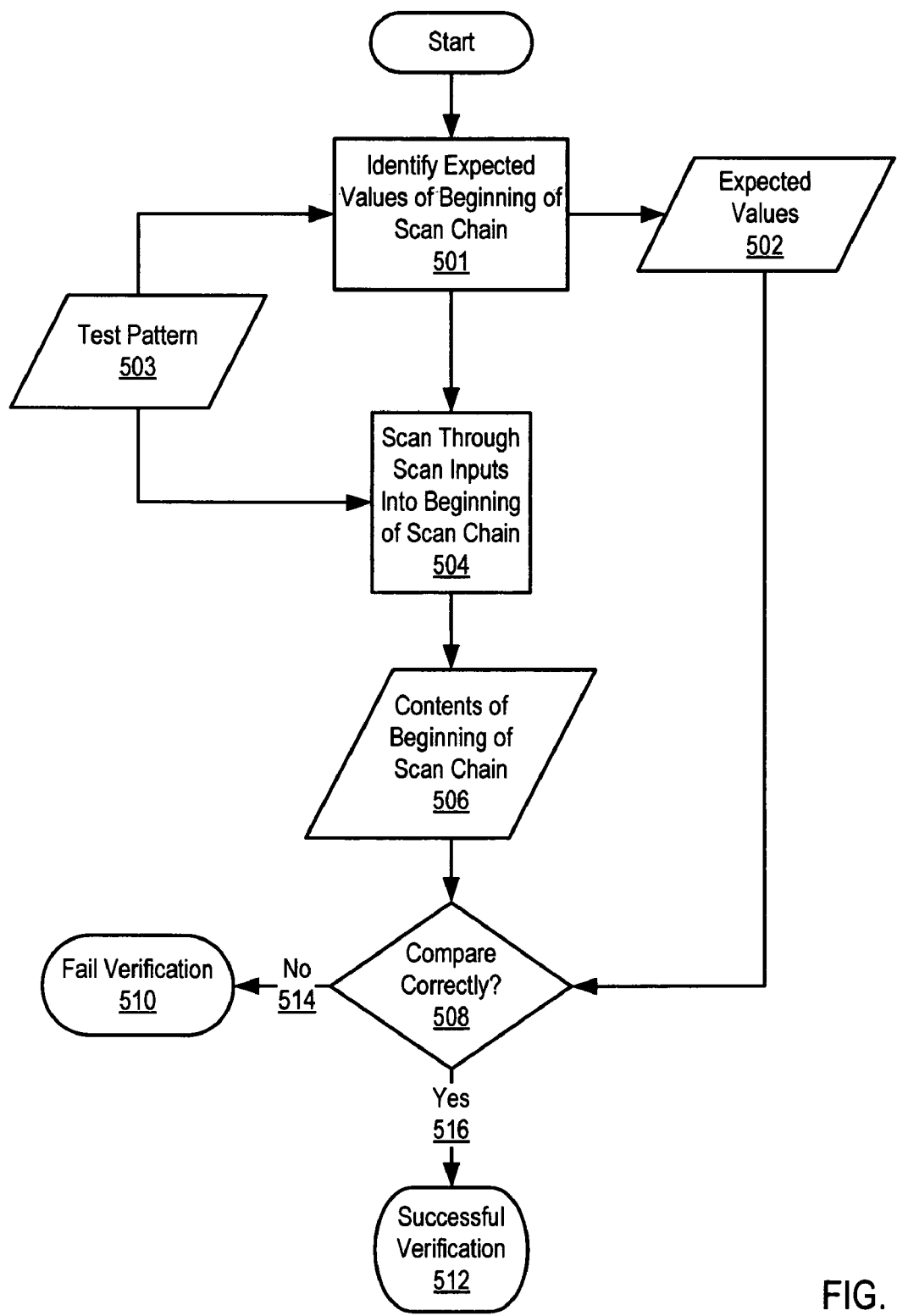
FIG. 5 sets forth a flow chart illustrating an exemplary method for verifying correct data entry from the scan inputs of the DUT into the beginning of the scan chain according to embodiments of the present invention.

For further explanation of verifying correct data entry into the beginning of a scan chain (402 on FIG. 4), FIG. 5 sets forth a flow chart illustrating an exemplary method for verifying correct data entry from the scan inputs of the DUT into the beginning of the scan chain according to embodiments of the present invention that includes identifying (501) expected values (502) of the beginning of a scan chain for a test pattern (503); scanning (504) the test pattern through the scan inputs into the beginning of the scan chain; and comparing (508) the expected values with the contents of the beginning of the scan chain after scanning in the test pattern. In silicon, comparing values anywhere in a scan chain with expected values requires scanning the values in the scan chain sequentially all the way through the scan chain to its output. In a simulation environment, however, the values of scan cells anywhere in the scan chain may be read directly in the environment. In the simulation environment, it is possible to scan a test pattern sequentially into the beginning of the scan chain and then directly compare the values in the beginning of the scan chain with expected values.

Correct data entry into the beginning of the scan chain entails that data represented by signals of the scanning process, that is, 'scan input data' (404 on FIG. 4), after the signals are introduced to the beginning of the scan chain by transmitting the signals serially through the scan inputs, is correctly represented by the current state of the beginning of the scan chain. Correct representation of the data by the current state of the beginning of the scan chain also takes into account the effect of inverters which may be present in the beginning of the scan chain. The beginning of the scan chain includes as many of the sequential scan cells, beginning with the first scan cell of the scan chain, as are needed to ensure that the signals representing the data are correctly transmitted by the scan inputs and that the data is correctly stored in the scan cells of the beginning of the scan chain. The number of scan cells needed to ensure accurate receipt of scan data in the beginning of the scan chain is not large. The beginning of the scan chain may, for example, include only 32 scan cells. In another example, the beginning of the scan chain may include 64 scan cells. Other sizes of the beginning of the scan chain will occur to those of skill in the art and all such sizes are well within the scope of the present invention.

In the example of FIG. 5, the test pattern includes a binary value for each scan cell in the beginning of the scan chain. Expected values (502) are related to the test pattern (503) by a transformation value which takes into account the presence of any inverters in the beginning of the scan chain. One exemplary test pattern would be an alternating sequence of 1s and 0s, depicted as:

1 0 1 0 1 0 in the case of a scan chain that has six scan cells in the beginning of the scan chain.

Using test pattern (503), if the scan chain contains no inverters, after scanning (504) a test pattern (503) through the scan inputs into the beginning of a scan chain, the contents of the beginning of the scan chain (506) are equal to the test pattern (503):

1 0 1 0 1 0,

In the present example, if there are no inverters in the beginning of the scan chain, the contents of the beginning of the scan chain (506) correctly compare with the expected values (502) when they are equal. If there are no inverters in the beginning of the scan chain, the test pattern (503) may be any sequence of the appropriate length composed of 1s and 0s, and the expected values (502) will be the same series of 1s and 0s.

However, in the method of FIG. 5, the beginning of the scan chain may contain one or more inverters. When the beginning of the scan chain contains inverters, the inverters affect the scanning in of data in a predictable manner, causing a change in the contents of the beginning of the scan chain (506) as compared to the test pattern (503). Because of this change in the contents of the beginning of the scan chain (506), the method of FIG. 5 must take into account the effect of the inverters on the contents of the beginning of the scan chain (506) when identifying (501) the expected values (502) of the beginning of the scan chain.

In one example of the method of FIG. 5, identifying (501) the expected values (502) of the beginning of the scan chain for a test pattern (503) is carried out by transforming the test pattern (503) with a transformation value created to predict the effect of inverters in the scan chain on the test pattern (503). In such an example, the method of FIG. 5 also includes creating a transformation value in dependence upon the location of inverters in the scan chain and transforming the test pattern (503) by the transformation value to produce the expected values (502) of the beginning of the scan chain. The positions of all the inverters in the scan chain are represented in operating data of the simulation environment.

The method of FIG. 5 also includes scanning (504) the test pattern (503) through the scan inputs into the beginning of the scan chain. Scanning (504) a test pattern (503) through the scan inputs into the beginning of a scan chain may be carried out by use of a JTAG interface or by from the use of test equipment connected in parallel to scan inputs of scan chains as described in more detail above with reference to FIG. 2.

The method of FIG. 5 also includes comparing (508) the expected values (502) with the contents of the beginning of the scan chain (506) after scanning (504) in the test pattern (503). The scan chain is part of a simulated DUT, and the simulation environment provides direct access to the contents of the scan chain at any time during simulation—so that the contents of the beginning of the scan chain are always available in the simulation environment for comparison with the expected values.

In the method of FIG. 5, the test pattern (503) may be any series of the appropriate length composed of 1s and 0s, such as, for example, a series of alternating 1s and 0s.

After transforming the test pattern (503) by the transformation value to produce the expected values (502) of the beginning of the scan chain, the contents of the beginning of the scan chain (506) compare correctly (516) with expected values (502) of the beginning of the scan chain if they are equal. In such an example, if the contents of the beginning of the scan chain (506) compare correctly with expected values of the scan chain (516), verification is successful (512). If the contents of the beginning of the scan chain (506) do not compare correctly with the expected values of the beginning of the scan chain (514), verification fails (510).

Figure 6:
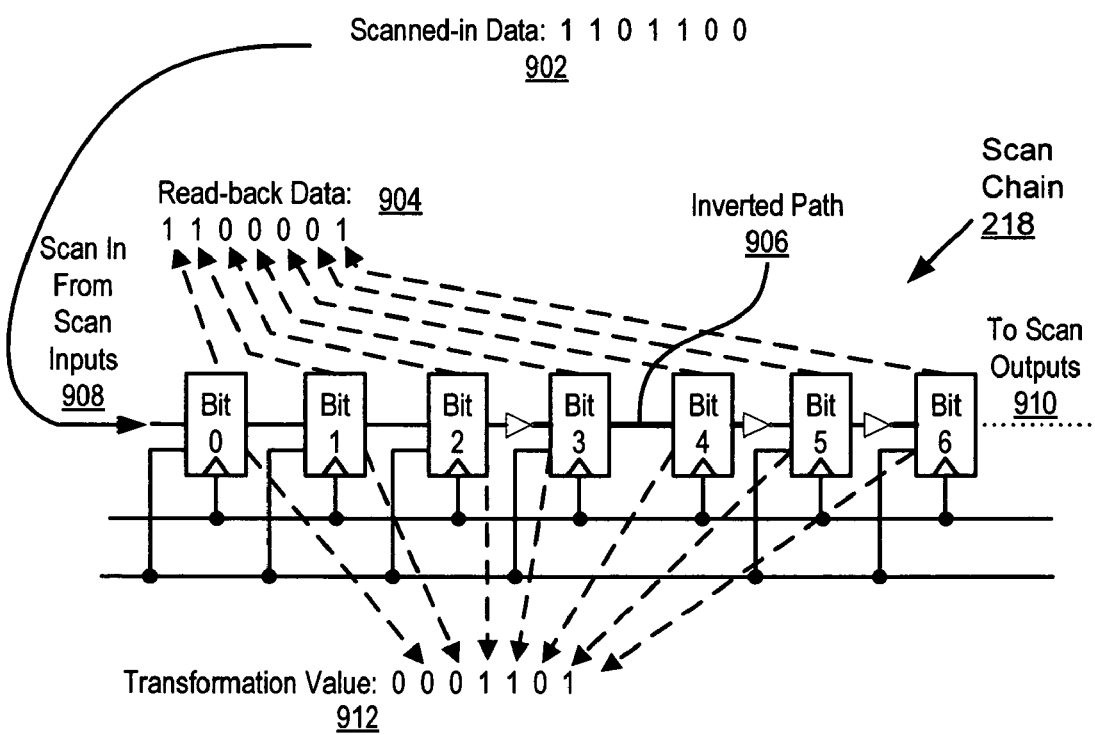
FIG. 6 sets forth a use case illustrating an exemplary method for verifying correct data entry from the scan inputs of the DUT into the beginning of the scan chain according to embodiments of the present invention.

For further explanation, FIG. 6 sets forth a use case illustrating an exemplary method for verifying correct data entry from the scan inputs of the DUT into the beginning of the scan chain according to embodiments of the present invention. In the example of FIG. 6, the beginning of the scan chain has 7 scan cells, read-back data (904), inverted paths (906), and scanned-in data (902). Read-back data (904) is the contents of the beginning of the scan chain accessed directly from the scan cells by using simulator commands. In this example, the read-back data (904) is a series of 1s and 0s with the values:

1 1 0 0 0 0 1 in the beginning of the scan chain. In the example of FIG. 6, scanned-in data (902) is the test pattern (503 in FIG. 5) scanned (908) into the scan chain through the scan inputs. In the example of FIG. 6, the scanned-in data (902) is the test pattern:

1 1 1 1 0 0.

In the use case of FIG. 6, if there are no inverters in the scan chain, and there is no error, the expected values of the beginning of the scan chain equal the test pattern:

1 1 0 1 1 0 0.

If, in the use case of FIG. 6, however, inverters are present, and therefore inverted paths (906) exist in the beginning of the scan chain, the expected values of the beginning of the scan chain do not equal the test pattern. An inverted path (906) occurs when, as data is scanned through the scan chain from the first scan cell in the scan chain to the last scan cell in the scan chain, the data encounters an inverter in the scan chain. The inverted path persists until another inverter is encountered in the scan chain or the data reaches the end of the scan chain. When scanned data enters a scan cell in the inverted path (906), its value is inverted until it reaches a scan cell not in an inverted path (906). In the method of FIG. 6, for example, a 0, scanned from the Bit 0 scan cell to the Bit 6 scan cell would have the following values:

at Bit 0: 0,
at Bit 1: 0,
at Bit 2: 0,
at Bit 3: 1 (the bit encounters the first scan cell in an inverted path, and it is inverted),
at Bit 4: 1 (the bit remains in the inverted path and remains inverted),
at Bit 5: 0 (the bit encounters a scan not in the inverted path and resumes its initial value),
at Bit 6: 1 (the bit encounters the first scan cell in the second inverted path, and it is inverted).

In the present example of FIG. 6, a transformation value (912) is created by taking into account the location of inverters in the scan chain through finding the scan-zero or scan-one values of the scan cells in the scan chain. Finding the scan-zero values of the scan cells in the scan chain is carried out by shifting a zero bit through the beginning of the scan chain and recording its value at each scan cell. The bit will have a 0 value in non-inverted scan cells and a 1 value in the inverted scan cells. The values of the bit as it is scanned through the scan chain from beginning at Bit 0 to Bit 6 are the values in the transformation value for the beginning of the scan chain.

For example, in the present example of FIG. 6, the scan-zero values are:

0 at Bit 0, 0 at Bit 1, 0 at Bit 2, 1 at Bit 3, 1 at Bit 4, 0 at Bit 5, and 1 at Bit 6, which results in a transformation value of:

0 0 0 1 1 0 1.

In the example of FIG. 6, this transformation value is used to transform a test pattern to produce expected values by operating a bitwise exclusive or (xor) operator with the transformation value as one operand and the test pattern as the other operand, as shown below.

| Test Pattern: | 1 1 0 1 1 0 0 |
|---|---|
| Transformation Value: | 0 0 0 1 1 0 1 |
| Transformation Process: | |
| 1 1 0 1 1 0 0 | |
| xor 0 0 0 1 1 0 1 | |
| = 1 1 0 0 0 0 1 | |
| Expected Value: | 1 1 0 0 0 0 1 |

In another example of identifying the expected values of the beginning of the scan chain for a test pattern of FIG. 6, the same transformed scanned-in data can be found by creating a transformation value by finding the scan-one values of the scan cells in the scan chain and recording those values; and operating a bitwise and operator with the transformation value. Other mathematically equivalent variations identifying the expected values of the beginning of the scan chain for a test pattern will occur to those of skill in the art, and all such variations are well within the scope of the present invention.

The Middle of a Scan Chain

Figure 7:
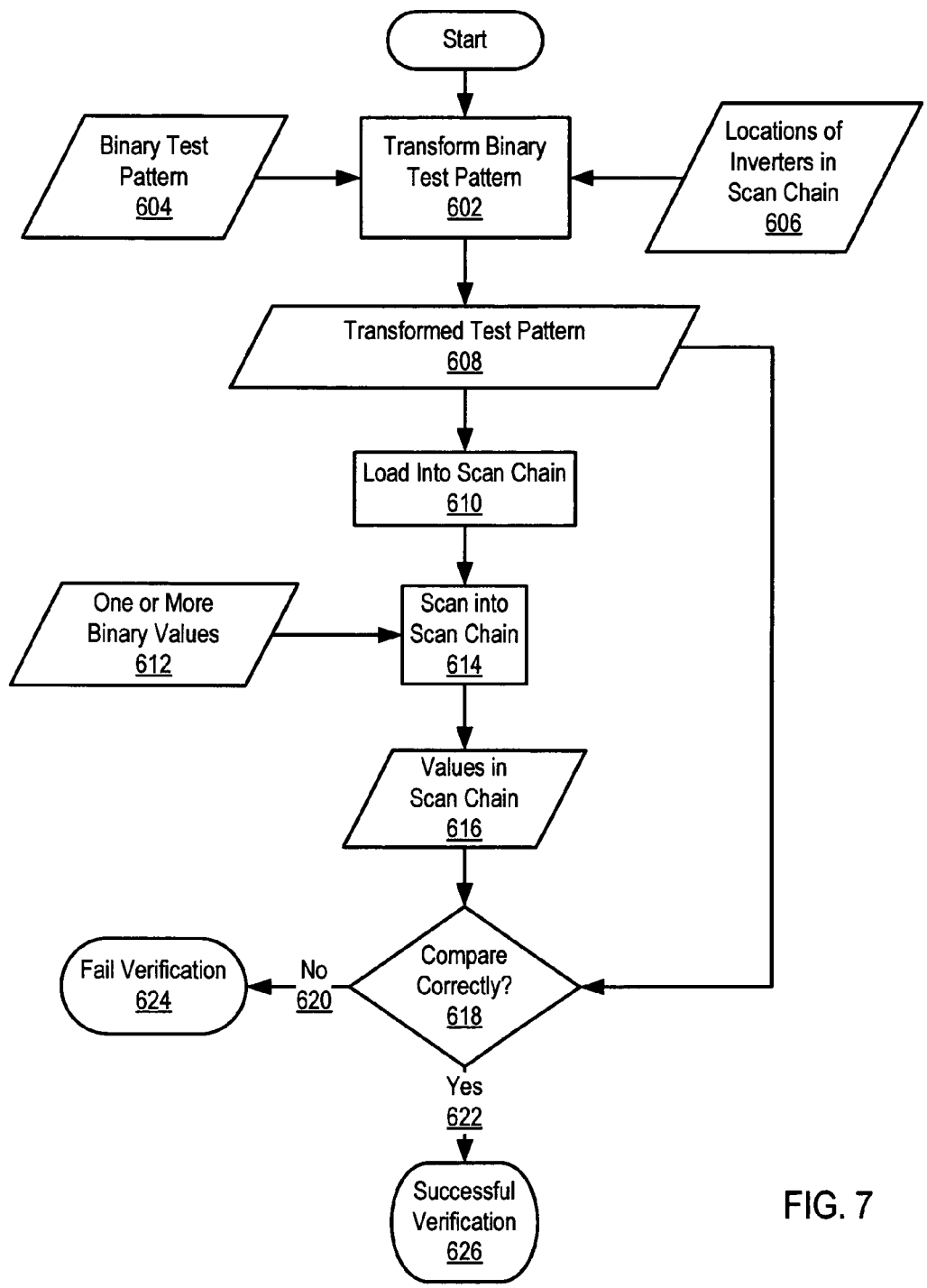
FIG. 7 sets forth a flow chart illustrating an exemplary method for verifying correct propagation of scan data in the scan chain between the scan inputs and the scan outputs according to embodiments of the present invention.

For further explanation, FIG. 7 sets forth a flow chart illustrating an exemplary method for verifying (reference 406 on FIG. 4) correct propagation of scan data in the scan chain between the scan inputs and the scan outputs according to embodiments of the present invention. As described in more detail below, in the method of FIG. 7, verifying correct propagation of scan data in the scan chain between the scan inputs and the scan outputs is carried out generally by transforming (602), in dependence upon locations of inverters in the scan chain, a binary test pattern comprising one binary value for each scan cell in the scan chain; loading (610) the transformed test pattern into the scan chain; scanning (614) into the scan chain one or more binary values; and after scanning in the binary values, comparing (618) values in the scan chain with the transformed test pattern. Correct propagation of scan data in the scan chain means that when data is scanned into the beginning of the scan chain, the data in the scan chain (408 in FIG. 4) is shifted correctly through the scan chain. That is, for each bit of data scanned into the scan chain, the state represented in each scan cell in the scan chain is correctly shifted over one scan cell. Correct propagation also takes into account the effect of inverters which may be present in the scan chain by inverting the value of a scan data whenever the scan data encounters an inverter.

The method of FIG. 7 includes transforming (602), in dependence upon locations of inverters in the scan chain (606), a binary test pattern (604) comprising one binary value for each scan cell in the scan chain. An exemplary test pattern may be a sequence of alternating 0s and 1s, depicted as:

1 0 1 1 0 1 in the case of a scan chain that has seven scan cells.

In the method of FIG. 7, transforming (602), in dependence upon locations of inverters in the scan chain (606), a binary test pattern (604) comprising one binary value for each scan cell in the scan chain is carried out by transforming the binary test pattern (604) with a transformation value created to account for the effect of inverters in the scan chain on the binary test pattern (604) being scanned in. Transforming (602) the binary test pattern (604) in such a manner simplifies comparing (618) values in the scan chain (616) with the transformed test pattern (608). The method of FIG. 7 also includes creating a transformation value in dependence upon the locations of inverters in the scan chain (606), as explained in more detail below with reference to FIG. 8.

The method of FIG. 7 also includes loading (610) the transformed test pattern (608) into the scan chain. As the DUT is a simulated device in a simulation, the simulator provides a means to store the value of all the scan cells into the scan cells of the DUT. Because the scan cells, being a part of the simulated device, are also simulated, the state of the scan cells, and therefore the values those states represent, can be directly manipulated by the simulator. For example, using simulator commands, a user may set or read the values of any or all of the memory elements in the DUT, including the scan cells. The simulator can also save to a file the names, values, and locations of all scan cells in a scan chain or in a DUT by use of the simulator. Loading (610) the transformed test pattern (608) into the scan chain may be carried out using simulator commands to directly set the values of the scan cells in the scan chain to the corresponding values in the loading test pattern. For example, the first scan cell in the scan chain is set to the first value of the transformed test pattern, the second scan cell in the scan chain is set to the second value of the transformed test pattern, and so on.

The method of FIG. 7 also includes scanning (614) into the scan chain one or more binary values (612). Scanning (614) into the scan chain one or more binary values (612) may include generating from test equipment connected to the scan inputs the one or more binary values (612). One example of the method of FIG. 7 includes scanning into the scan chain a 1 followed by a 0.

The method of FIG. 7 also includes, after scanning (614) in one or more binary values (612), comparing (618) values in the scan chain (616) with the transformed test pattern (608). Comparing (618) values in the scan chain (616) with the transformed test pattern (608) entails reading the values in the scan chain (616) and determining if the values in the scan chain (616) correctly compare with the transformed test pattern (608). Reading the values in the scan chain (616) is carried out by extracting the values of all scan cells in the scan chain using simulator commands.

Using the binary test pattern above, if the scan chain contained no inverters and the scan chain is functioning correctly, after loading (610) the transformed test pattern (608) into the scan chain, the values in the scan chain (616) would equal those of the binary test pattern (604):

1 0 1 0 1 0 1.

After scanning (614) into the scan chain one or more binary values (612), such as, for example, a 0, the values in the scan chain should equal that of the inverse of the binary test pattern (604):

0 1 0 1 0 1 0.

In another example, after scanning (614) into the scan chain, a 0 followed by a 1, the values of the scan chain should again equal that of the binary test pattern (604):

1 0 1 0 1 0 1.

In the present example, with no inverters in the scan chain, the values in the scan chain (616) correctly compare with the transformed test pattern (608) when they are equal. If there are no inverters in the scan chain, and if N binary values are scanned into the scan chain, the binary test pattern may be any sequence of the appropriate length composed of 1s and 0s, and the values in the scan chain (616) will be the same series of 1s and 0s with the last N binary values removed, and the N binary values prepended to the beginning.

In the method of FIG. 7, however, the scan chain may contain one or more inverters, and when it does, the inverters will affect the scanning in of data in a predictable manner, causing a change in the values of the scan chain (616)—a predictable change according to the locations of the inverters in the scan chain. Because of this change in the values of the scan data in the scan chain, the method of FIG. 7 takes into account the effect of the inverters on data shifted through the scan chain when comparing (618) values in the scan chain (616) with the transformed test pattern (608).

In the example of FIG. 7, when the scan chain contains one or more inverters, the binary test pattern is a sequence of alternating 1s and 0s, the transformed test pattern comprises the binary test pattern transformed by the transformation value, and the inverse of the first bit of the test pattern may be scanned into the scan chain, followed by the first bit of the test pattern. In such an example, if there is no error, the values in the scan chain (616) after scanning in the binary values equal the transformed test pattern (608).

Alternatively in the example of FIG. 7, the binary test pattern may be any sequence of 1s and 0s, the transformed test pattern is made up of the binary test pattern transformed by the transformation value, and any pattern of binary values may be scanned into the scan chain. In such an example, comparing (618) values in the scan chain (616) with the transformed test pattern (608) is carried out by some other method of calculation of the change in actual values caused by shifting the values through inverters, such as, for example, simulated shift calculation. In a simulated shift calculation, the value in each scan cell is determined using the value from the previous scan cell as modified by any existing inverters between them. The value of the first scan cell is determined using the value from the input into the scan chain as modified by any existing inverters, and the value of the last scan cell, as modified by any existing inverters, is shifted out of the scan cell as output.

In the method of FIG. 7, if the values in the scan chain (616) compare correctly (622) with the transformed test pattern (608), scan verification is successful (626). If the values in the scan chain (616) do not (620) compare correctly with the transformed test pattern, verification fails (624). In this context, correct comparison of the values in the scan chain and the transformed test pattern means that the values in the scan chain are identical to the transformed test pattern.

Figure 8:
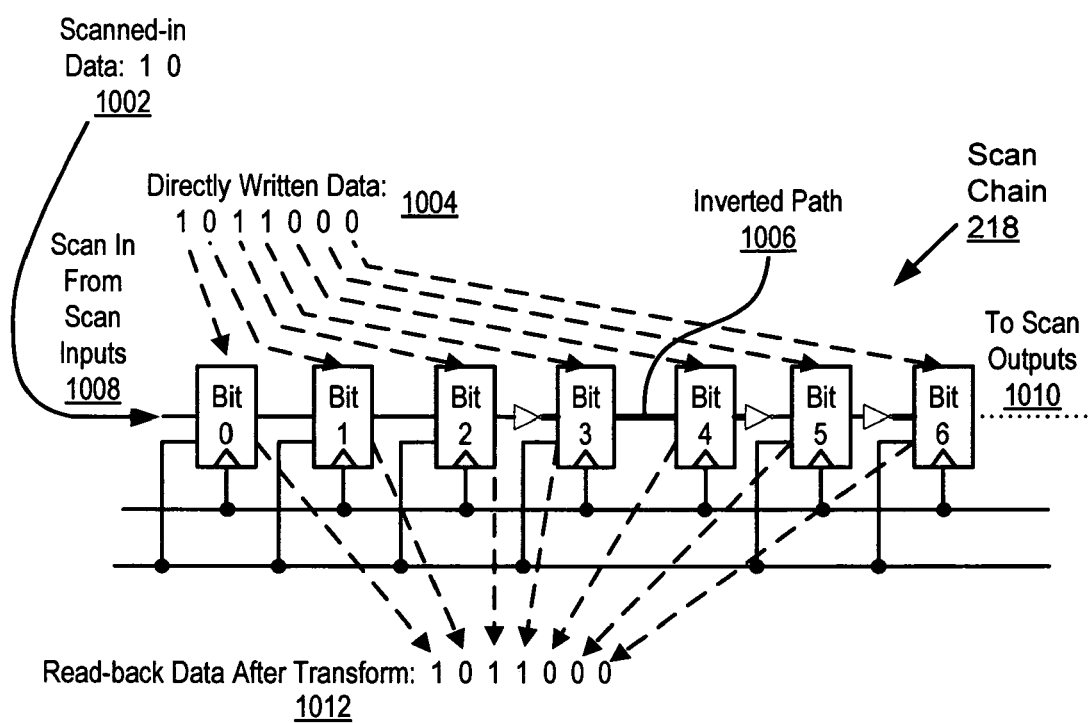
FIG. 8 sets forth a use case illustrating an exemplary method for verifying correct propagation of scan data in the scan chain between the scan inputs and the scan output according to embodiments of the present invention.

For further explanation, FIG. 8 sets forth a use case illustrating an exemplary method for verifying correct propagation of scan data in the scan chain between the scan inputs and the scan output according to embodiments of the present invention. In the method of FIG. 8, the scan chain has seven scan cells, directly written data (1004), inverted paths (1006), scanned-in data (1002), and read-back data (1012). Directly written data (1004) is the transformed test pattern loaded into the scan cells by using simulator commands. Read-back data (1012) is the values in the scan chain accessed by using simulator commands.

In the example of FIG. 8, using the binary test pattern above, if there are no inverters, the directly written data (1004), or the transformed test pattern, is the same as the binary test pattern, with the values 1 0 1 0 1 0 1 at the beginning of the scan chain and the values 1 0 1 0 1 0 1 at the end of the scan chain.

In the example of FIG. 8, scanned-in data is the inverse of the first binary value in the binary test pattern followed by the first binary value in the binary test pattern, depicted as:

1 0, as 0, the first value scanned in, is the inverse of the first binary value in the binary test pattern, and 1, the second value scanned in, is the first binary value in the binary test pattern.

In the use case of FIG. 8, if there are no inverters in the scan chain, the expected values are determined by shifting the data values in the scan chain over two positions to the right, removing the last two values (representing the data transmitted to the scan output), and appending the values of the scanned-in data, 1 0 in the present example, to the beginning of the chain. In the present example of FIG. 8, which uses a binary test pattern of alternating 1s and 0s, if there are no inverters in the scan chain, the expected values of the scan chain are equal to the binary test pattern:

1 0 1 0 1 0 1 . . . 1 0 1 0 1 0 1.

In one example of the use case of FIG. 8, however, if inverters are present, and therefore inverted paths (1006) exist, the binary test pattern is a series of alternating 1s and 0s with the values 1 0 1 0 1 0 1 at the beginning of the binary test pattern and the values 1 0 1 0 1 0 1 at the end of the binary test pattern. An inverted path (1006) occurs when, as data is shifted through the scan chain from the first scan cell in the scan chain to the last scan cell in the scan chain, the data encounters an inverter in the scan chain. The inverted path persists until another inverter is encountered in the scan chain or the data reaches the end of the scan chain. When shifted data enters a scan cell in the inverted path (1006), its value is inverted until it reaches a scan cell not in an inverted path (1006). In the method of FIG. 8, for example, a 0 value, shifted from the Bit 0 scan cell to the Bit 6 scan cell would have the following values:

at Bit 0: 0,
at Bit 1: 0,
at Bit 2: 0,
at Bit 3: 1 (the bit encounters the first scan cell in an inverted path, and it is inverted),
at Bit 4: 1 (the bit remains in the inverted path and remains inverted),
at Bit 5: 0 (the bit encounters a scan not in the inverted path and resumes its initial value),
at Bit 6: 1 (the bit encounters the first scan cell in the second inverted path, and it is inverted).

In the example of FIG. 8, a transformation value is created by taking into account the location of inverters in the scan chain through finding the scan-zero or scan-one values of the scan cells in the scan chain. Finding the scan-zero values of the scan cells in the scan chain is carried out by shifting a zero bit through the scan chain and recording its value at each scan cell. The bit will have a 0 value in non-inverted scan cells and a 1 value in the inverted scan cells. The values of the bit as it shifts through the scan chain from beginning to end are the values in the transformation value for the scan chain.

In the example of FIG. 8, the scan-zero values are:

0 at Bit 0, 0 at Bit 1, 0 at Bit 2, 1 at Bit 3, 1 at Bit 4, 0 at Bit 5, and 1 at Bit 6, with similar values at the end of the scan chain, which results in a transformation value of: 0 0 0 1 1 0 1.

In the example of FIG. 8, this transformation value is used to transform a binary test pattern of alternating 1s and 0s into a loading test pattern by operating a bitwise exclusive or (xor) operator with the transformation value as one operand and the binary test pattern as the other operand, as shown below.

| Binary Test Pattern: | 1 0 1 0 1 0 1 |
| Transformation Value: | 0 0 0 1 1 0 1 |
| 1 0 1 0 1 0 1 | |
| xor 0 0 0 1 1 0 1 | |
| = 1 0 1 1 0 0 0 | |
| Transformed Test Pattern: | 1 0 1 1 0 0 0 |

In the example of FIG. 8, the same transformed test pattern can be found by creating a transformation value by finding the scan-one values of the scan cells in the scan chain and recording those values and operating a bitwise and operator with the transformation value. Other mathematically equivalent variations of this process for creating a transformation value will occur to those of skill in the art, and all such variations are well within the scope of the present invention.

In the example of FIG. 8, the transformed test pattern is loaded directly into the scan cells of the scan chain. After loading the scan cells with the loading test pattern, the scan cells are in the same state and hold the same values as they would if the binary test pattern had been scanned into the scan cells.

In the present example of the use case of FIG. 8, test equipment (not shown) scans in scan data through scan inputs. In the present example, scanned-in data is the inverse of the first binary value in the binary test pattern followed by the first binary value in the binary test pattern. In the present example, the scanned in data is the values 1 0, as 0, the first value scanned in, is the inverse of the first binary value in the binary test pattern, and 1, the second value scanned in, is the first binary value in the binary test pattern.

In the present example of the use case of FIG. 8, the contents of the first seven scan cells after scanning in the data are determined by shifting the scan chain with the scanned-in data (1002), as follows:

| | |
|---|---|
| State of Scan Cells Just After Loading: | 1 0 1 1 0 0 0 |
| State of Scan Cells After Scanning In 0: | 0 1 0 0 1 1 1 |
| State of Scan Cells After Scanning In 1: | 1 0 1 1 0 0 0 |

In the present example of the use case of FIG. 7, after scanning in the 0 and the 1, the scan cells, if propagating correctly, have returned to their state just after loading the transformed test pattern. Thus, in the present example, the values in the scan chain compare correctly to the transformed test pattern when they are equal.

Alternatively, in the use case of FIG. 8, the binary test pattern may be any sequence of 1s and 0s, the transformed test pattern comprises the binary test pattern transformed by the transformation value, and any pattern of binary values may be scanned into the scan chain. In such an example, comparing (618) values in the scan chain (616) with the transformed test pattern (608) is carried out by some other method of calculation of the change in actual values caused by shifting the values through inverters, such as, for example, simulated shift calculation.

The End of a Scan Chain

Figure 9:
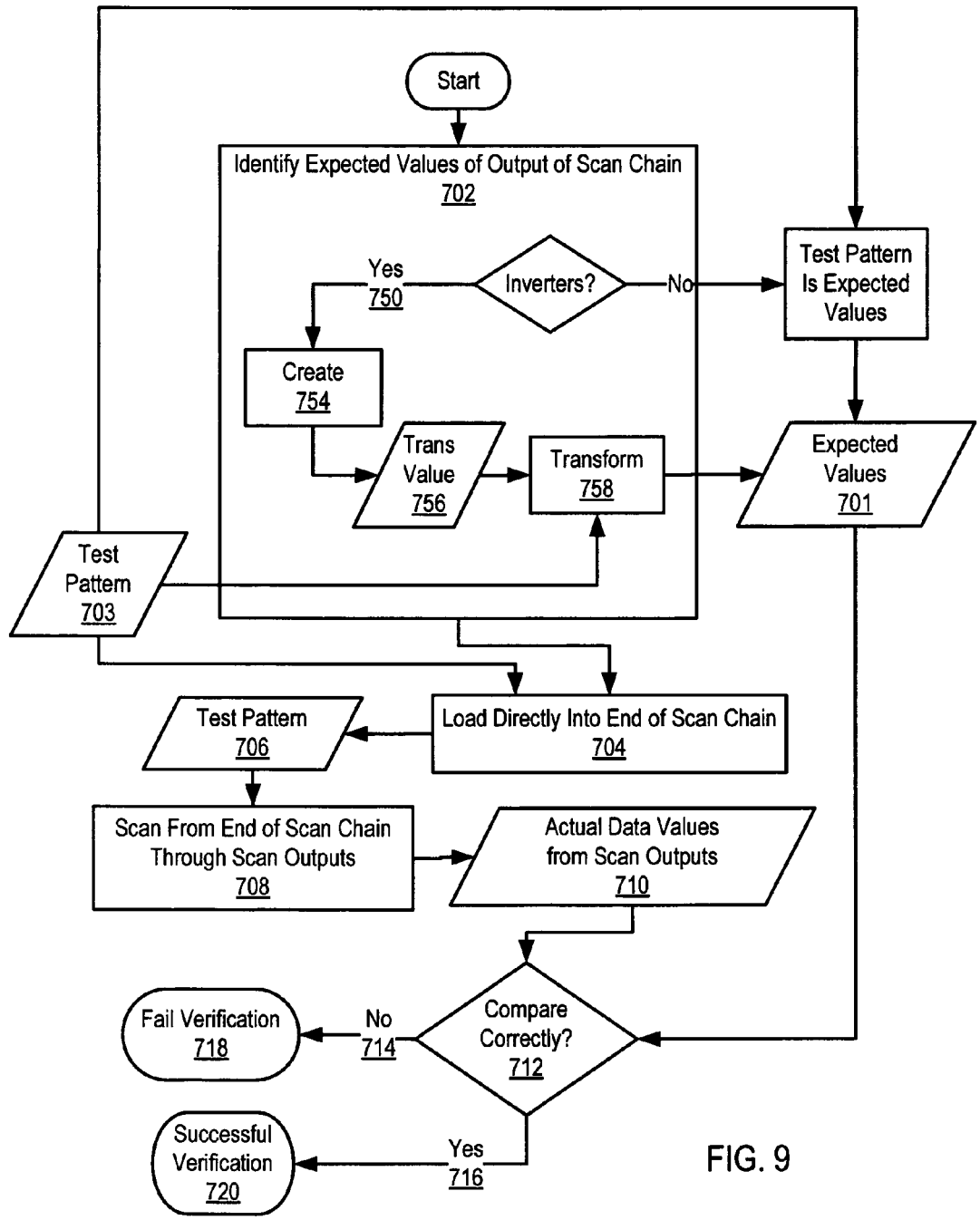
FIG. 9 sets forth a flow chart illustrating an exemplary method for verifying correct data output from the end of the scan chain to the scan outputs according to embodiments of the present invention.

For further explanation, FIG. 9 sets forth a flow chart illustrating an exemplary method for verifying (410 on FIG. 2) correct data output from the end of the scan chain to the scan outputs according to embodiments of the present invention. Correct data output from the end of the scan chain means that data output from the end of the scan chain (412 in FIG. 4), or data represented by the state of the end of the scan chain before scanning out, is, after the data is transmitted serially through the scan outputs, correctly represented by output signals of the scanning process or scan output data. Correct representation of the data by output signals of the scanning process also takes into account the effect of inverters which may be present in the end of the scan chain. The end of the scan chain includes as many of the sequential scan cells, ending with the last scan cell of the end of scan chain, as are needed to ensure that the data is correctly shifted through the end of the scan chain and that the signals representing the data are correctly transmitted by the scan outputs. The number of scan cells needed to ensure propagation of scan data through the end of a scan chain is not large. The end of the scan chain may, for example, include only 32 scan cells. In another example, the end of the scan chain may include 64 scan cells. Other sizes for the end of a scan chain will occur to those of skill in the art and all such sizes are well within the scope of the present invention.

The method of FIG. 9 includes identifying (702) expected values (701) of the output of a scan chain for a test pattern (703), the test pattern comprising a binary value for each scan cell in the end of the scan chain. Expected values (701) are related to the test pattern (703) by a transformation value which takes into account the presence of any inverters in the end of the scan chain. One exemplary test pattern would be an alternating sequence of 1s and 0s, depicted as:

1 0 1 0 1 0 in the case of a scan chain that has six scan cells.

The method of FIG. 9 also includes loading (704) the test pattern (703) directly into the end of the scan chain. The ability to directly load values into simulated circuit components, including scan cells, is an attribute of the simulation environment. In the method of FIG. 9, loading (704) the test pattern (703) directly into the end of the scan chain is carried out by setting the values of all scan cells in the end of the scan chain using simulator commands. For example, the first scan cell in the scan chain is set to the first value of the test pattern, the second scan cell in the scan chain is set to the second value of the test pattern, and so on, until the test pattern is in the end of the scan chain.

The method of FIG. 9 also includes scanning (708) the test pattern (706) from the end of the scan chain through the scan outputs. Scanning (708) the test pattern (706) from the end of the scan chain through the scan outputs is carried out by scanning in a pattern with the same number of bits that are desired to be scanned from the end of the scan chain and capturing the data scanned out from the scan output.

Using the test pattern (703) set forth above, 1 0 1 0 1 0, if the end of the scan chain contains no inverters, after scanning (708) the test pattern (706) from the end of the scan chain through the scan outputs, the actual data values (710) from scan outputs are equal to the test pattern (703, 706):

1 0 1 0 1 0.

The method of FIG. 9 also includes comparing (712) actual data values (710) from the scan outputs with the expected values (701). In the method of FIG. 9, comparing (712) actual data values (710) from the scan outputs with the expected values (701) entails capturing actual data values (710) from the scan outputs and determining if the actual data values (710) from the scan outputs correctly compare with the expected values (701). The actual data values (710) from the scan outputs correctly compare with the expected values (701) when they are equal. If there are no inverters in the end of the scan chain, the test pattern (703) may be any sequence of the appropriate length composed of 1s and 0s, and the expected values (701) will be the same series of 1s and 0s.

When there are inverters in the end of the scan chain, however, the inverters will affect the scanning out of data in a predictable manner, causing a change in the actual data values (710) from the scan outputs as compared to the test pattern (703). When there are inverters in the end of the scan chain (750), therefore, in the method of FIG. 9, identifying (702) expected values (701) of the output of a scan chain for a test pattern (703) is carried out by transforming (758) the test pattern (703) with a transformation value created to predict the effect of inverters in the scan chain on the test pattern (703). In such an example, the method of FIG. 9 also includes creating (754) a transformation value (756) in dependence upon the location of inverters in the scan chain and transforming (758) the test pattern (703) by the transformation value to produce the expected values (701) of the output of a scan chain. The positions of the inverters in the scan chain is an attribute of the simulation environment and available from it.

In the example of FIG. 9, the test pattern (703) may be any series of the appropriate length composed of 1s and 0s, such as, for example, a series of alternating 1s and 0s. After transforming the test pattern (703) by the transformation value to produce the expected values (701) of the output of a scan chain, the actual data values (710) from the scan outputs compare correctly (716) with expected values (701) of the output of a scan chain when they are equal. In such an example, if the actual data values (710) from the scan outputs compare correctly with the expected values (701) of the output of the scan chain (716), verification is successful (720), and if the actual data values (710) from the scan outputs do not (714) compare correctly with the expected values (701) of the output of the scan chain, verification fails (718).

Figure 10:
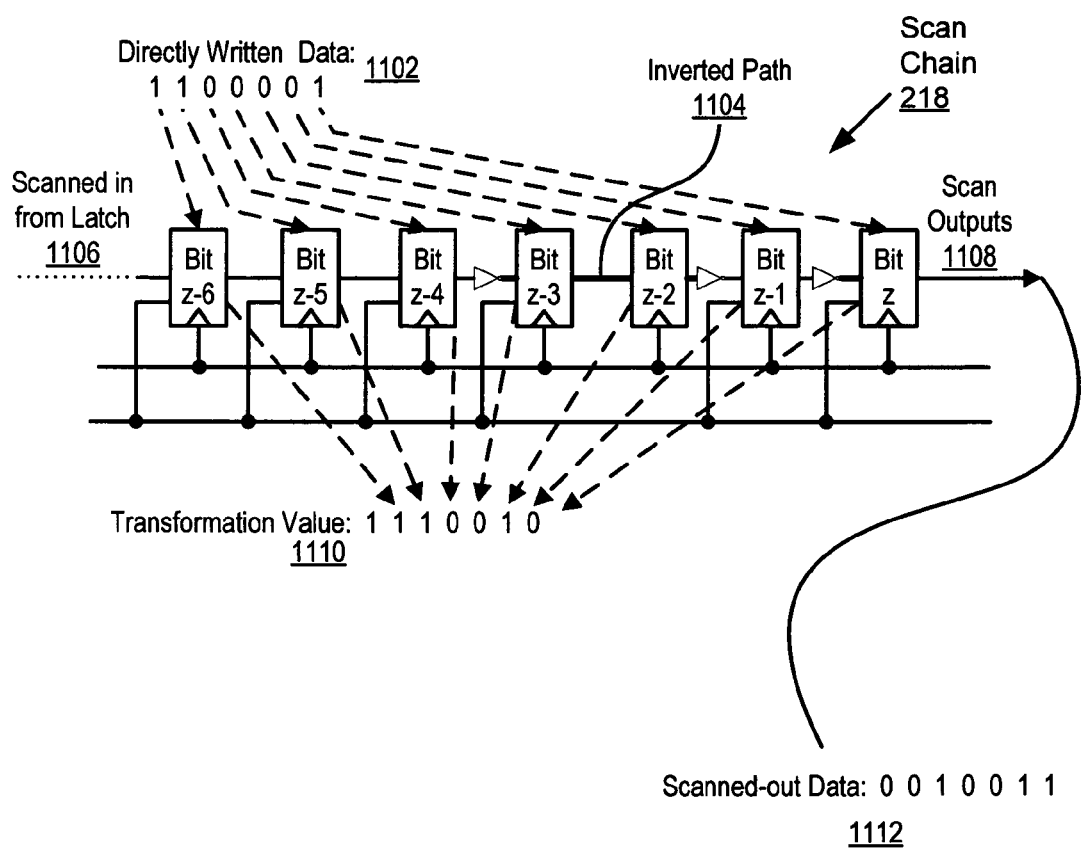
FIG. 10 sets forth a use case illustrating an exemplary method for verifying correct data output from the end of the scan chain to the scan outputs according to embodiments of the present invention.

For further explanation, FIG. 10 sets forth a use case illustrating an exemplary method for verifying correct data output from the end of the scan chain to the scan outputs according to embodiments of the present invention. In one example of the use case of FIG. 10, the end of the scan chain has 7 scan cells, directly written data (1102), inverted paths (1104), and scanned-out data (1112). Directly written data (1102) is the test pattern loaded directly into the scan cells by using simulator commands. In the present example, the directly written data (1102) is a series of 1s and 0s with the values:

1 1 0 0 0 0 1 at the end of the scan chain.

In the use case of FIG. 10, scanned-out data (1112) is the directly written data (1102) which is scanned from the end of the scan chain through the scan outputs. In the example of FIG. 10, the scanned-out data (1112) is the value: 0 0 1 0 0 1 1.

In the use case of FIG. 10, if there were no inverters in the scan chain, and there were no scan errors, the expected values of the output of a scan chain would equal the test pattern: 1 1 0 0 0 0 1.

If, in the method of FIG. 10, however, inverters are present, and therefore inverted paths (1104) exist, the expected values of the output of a scan chain do not equal the test pattern. An inverted path (1104) occurs when data encounters an inverter in the scan chain as the data is scanned through the scan chain from the first scan cell in the scan chain to the last scan cell in the scan chain. The inverted path persists until another inverter is encountered in the scan chain or the data reaches the end of the scan chain. When scanned data enters a scan cell in the inverted path (1104), the value of the data is inverted until the data reaches a scan cell not in an inverted path (1104). In the method of FIG. 10, for example, a 0 scanned from the Bit z-6 scan cell to the Bit z scan cell would have the following values:

- at Bit z-6: 0,
- at Bit z-5: 0,
- at Bit z-4: 0,
- at Bit z-3: 1 (the bit encounters the first scan cell in an inverted path, and it is inverted),
- at Bit z-2: 1 (the bit remains in the inverted path and remains inverted),
- at Bit z-1: 0 (the bit encounters a scan not in the inverted path and resumes its initial value),
- at Bit z: 1 (the bit encounters the first scan cell in the second inverted path, and it is inverted).

In the present example of FIG. 10, a transformation value (1110) is created by taking into account the location of inverters in the scan chain through finding the scan-zero or scan-one values of the scan cells in the scan chain. Finding the scan-zero values of the scan cells in the scan chain is carried out by shifting a bit of data initially set to 0 through the end of the scan chain and recording changes in the value of the bit at each scan cell. The bit will have a 0 value in non-inverted scan cells and a 1 value in the inverted scan cells. The values of the bit as it is scanned through the scan chain from Bit z-6 to Bit z are the values in the transformation value for the beginning of the scan chain.

In the present example of FIG. 10, the scan-zero values are:

0 at Bit z-6, 0 at Bit z-5, 0 at Bit z-4, 1 at Bit z-3, 1 at Bit z-2, 0 at Bit z-1, and 1 at Bit z, which results in a transformation value of:

0 0 0 1 1 0 1.

Because all of the data being scanned out is still in an inverted state due to the last inverter, this transformation value is inverted, giving a transformation value of:

1 1 1 0 0 1 0.

In the example of FIG. 10, this transformation value is used to transform a test pattern to produce expected values by operating a bitwise exclusive or (xor) operator with the transformation value as one operand and the test pattern as the other operand, as shown below.

| | |
|---|---|
| Test Pattern: | 1 1 0 0 0 0 1 |
| Transformation Value: | 1 1 1 0 0 1 0 |
| Transformation Process: | |
| | 1 1 0 1 1 0 0 |
| xor | 1 1 1 0 0 1 0 |
| = | 0 0 1 0 0 1 1 |
| Expected Values: | 0 0 1 0 0 1 1 |

In the example of FIG. 10, the same expected values may be found by creating a transformation value by finding the scan-one values of the scan cells in the scan chain and recording those values; and operating a bitwise and operator with the transformation value. Other mathematically equivalent variations of this process of creating a transformation value will occur to those of skill in the art, and all such variations are well within the scope of the present invention.

In the present example, the test pattern may be any series of the appropriate length composed of 1s and 0s, such as, for example, a series of alternating 1s and 0s. After transforming the test pattern by the transformation value to produce the expected values of the output of a scan chain, the actual data values from the scan outputs compare correctly with expected values of the output of a scan chain when they are equal. In such an example, if the actual data values from the scan outputs compare correctly with the expected values of the output of the scan chain, scan verification is successful, and if the actual data values from the scan outputs do not compare correctly with the expected values of the output of the scan chain, scan verification fails.

Leak Testing a Scan Chain

Figure 11:
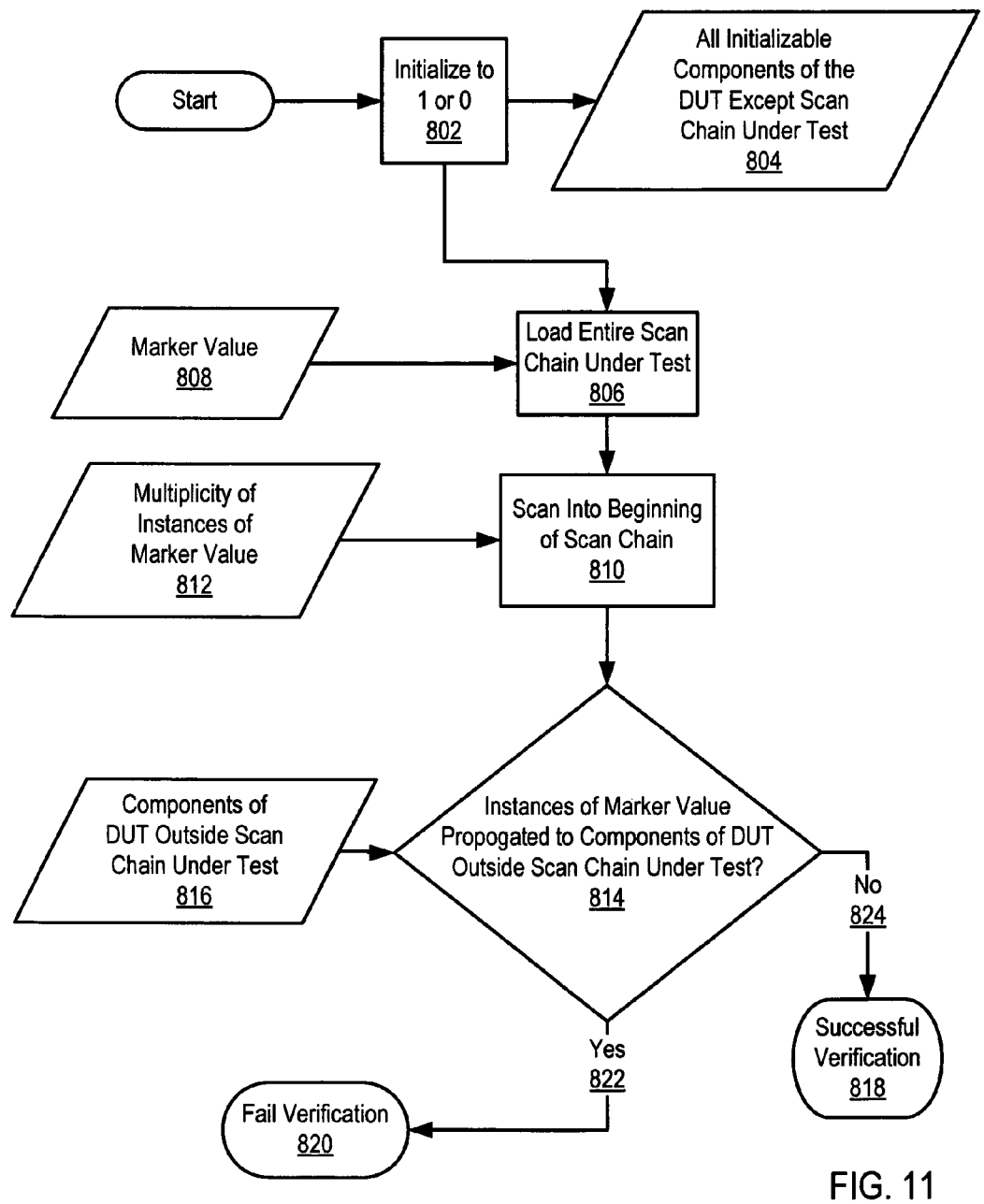
FIG. 11 sets forth a flow chart illustrating an exemplary method for leak testing the scan chain with undetermined states for scan cells in the scan chain according to embodiments of the present invention.

For further explanation, FIG. 11 sets forth a flow chart illustrating an exemplary method for leak testing (414 on FIG. 4) the scan chain with undetermined states for scan cells in the scan chain according to embodiments of the present invention. Leak testing (414) determines whether data values in memory elements outside the scan chain remain unchanged during scan operations. In the method of FIG. 11, state values of the simulator include a propagatable marker value. In the method of FIG. 11, the propagatable marker value (808) is an undetermined state, depicted as "X", which is a construct of the simulation. The marker value (808) denotes an unknown value in the simulated DUT. Leak testing is effected generally according to embodiments of the present invention by using undetermined states for scan cells in the scan chain (416 in FIG. 4). An undetermined state is a software construct, in effect a third logical state of a memory element, used to label unknown values of memory elements in a simulated DUT. That is, each simulated memory element may have values of 0, 1, or 'undetermined.' The undetermined state is represented in this specification as an 'X'—so that simulated memory elements may have the values 0, 1, and X.

The marker value (808) has the characteristic of fast propagation which makes it useful in leak testing because leaks can be detected by scanning in a relatively small number of scan values. The fast propagation of the marker value (808) can be explained by the marker value's behavior in the simulation. A logical OR operation with an undetermined state as one operand and 0 as the other operand will always result in the undetermined state as the outcome, because whether the undetermined state is 1 or 0, the outcome is always determined by the value of the undetermined state, and the output is the same as the undetermined state. A logical OR operation with an undetermined state as one operand and 1 as the other operand will always result in 1 as the outcome, because whether the undetermined value is 1 or 0, the output will be 1. A logical AND operation with an undetermined state as one operand and 1 as the other operand will always result in the undetermined state as the outcome because whether the undetermined state is 1 or 0, the outcome is always determined by the value of the undetermined state, and the output is the same as the undetermined state. A logical AND operation with an undetermined state as one operand and 0 as the other operand will always result in 0 as the outcome, because whether the undetermined value is 1 or 0, the output will be 0.

In the method of FIG. 11, leak testing a scan chain with undetermined states for scan cells in the scan chain includes initializing (802) to 1 or 0 all initializable components of the DUT, including the scan chains, except for one scan chain under test (804). In the method of FIG. 11, the initializable components of the DUT may include scan cells in the scan chains of the DUT, non-scanning latches, and staging latches. Non-scanning latches are latches in the DUT which are used in the functional mode of the DUT but are not included in a scan chain. Staging latches are latches within the scan chain, and having a separate clock, which negate any problems caused by the speed of the scanning cycle in comparison to the actual distance that signals must travel on the DUT. In the example of FIG. 11, initializing (802) to 1 or 0 all initializable components of the DUT, including the scan chains, except for one scan chain under test (804), may be carried out by retrieving the locations of all the initializable components and the locations of the components of the scan chain from a data structures in the simulation environment, accessing all of the initializable components of the DUT except for the initializable components in the excepted scan chain, and setting the values of those initializable components to 1 or 0. Such initializable components typically include all or most of the memory elements, flip-flops, latches, and the like in the DUT.

In the method of FIG. 11, leak testing a scan chain with undetermined states for scan cells in the scan chain also includes loading (806) an entire scan chain under test with a marker value (808). Loading (806) an entire scan chain under test with a marker value (808) is carried out by retrieving the locations of all the scan cells of the scan chain under test from data structures of the simulation environment, accessing directly through the simulation environment all of the scan cells of the scan chain under test, and setting the values of the scan cells of the scan chain equal to the marker value (808).

In the method of FIG. 11, leak testing the scan chain with undetermined states for scan cells in the scan chain also includes scanning (810) into the beginning of the scan chain a multiplicity of instances of the marker value (812). In one example of the method of FIG. 11, scanning (810) into the beginning of the scan chain a multiplicity of instances of the marker value (812) is carried out by scanning into a scan input of the scan chain under test a multiplicity of instances of the marker value (812).

In the method of FIG. 11, leak testing the scan chain with undetermined states for scan cells in the scan chain also includes determining (814) whether instances of the marker value are propagated to components of the DUT outside the scan chain under test (816). Determining (814) whether instances of the marker value are propagated to components of the DUT outside the scan chain under test (816) is carried out by retrieving the identities of the components of the DUT from data structures of the simulation environment, retrieving the locations of all the components of the scan chain from data structures of the simulation environment, and comparing the values of components of the DUT outside the scan chain to the marker value (808). Finding the marker value in any DUT components outside the scan chain under test indicates a leak. That is, if the values of components of the DUT outside the scan chain are equal to the marker value, then instances of the marker value have propagated to components of the DUT outside the scan chain (822), and verification fails (820). If no values of components of the DUT outside the scan chain are equal to the marker value, then instances of the marker value have not (824) propagated to components of the DUT outside the scan chain, and verification is successful (818).

Figure 12:
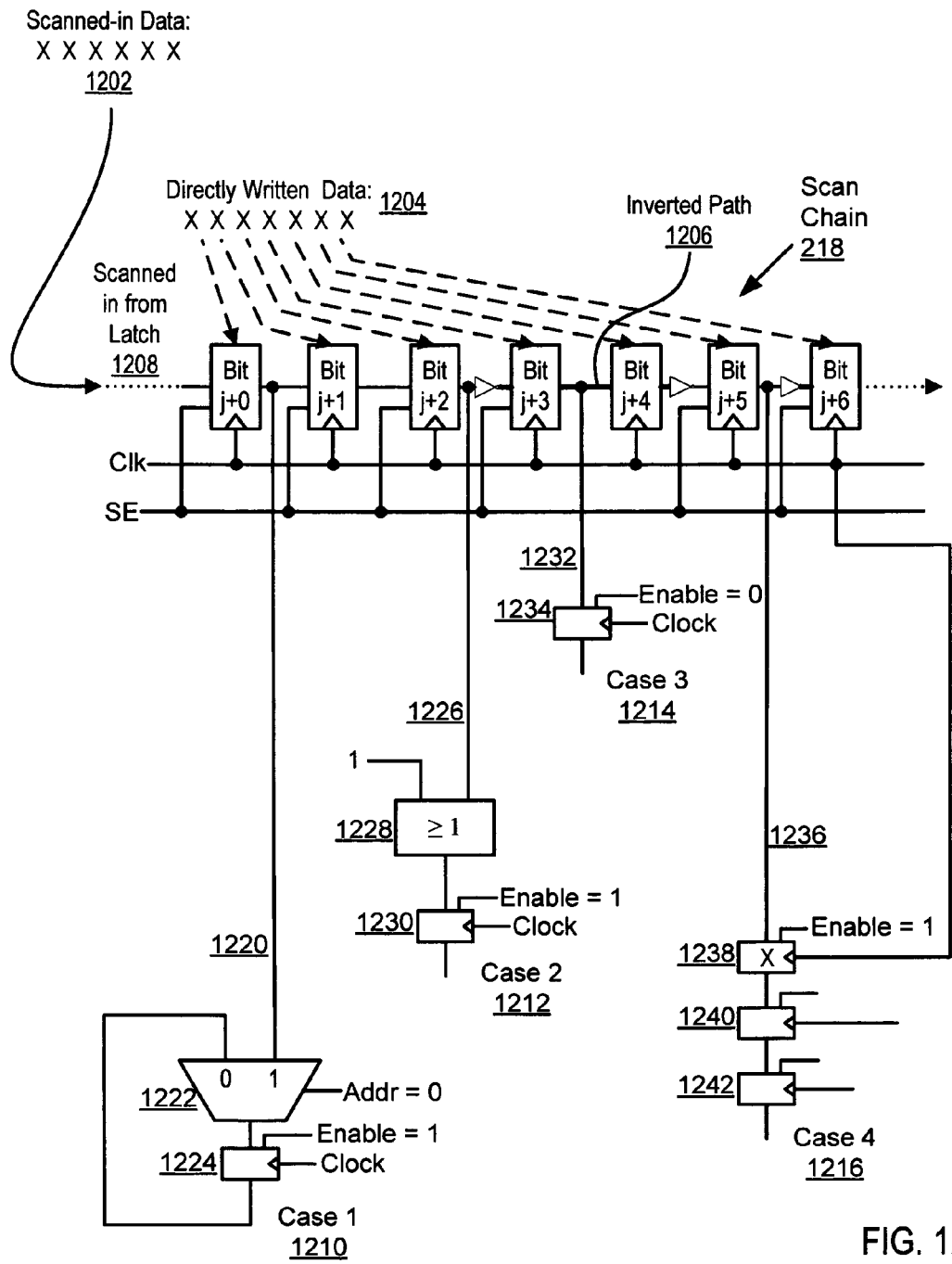
FIG. 12 sets forth a use case illustrating an exemplary method for leak testing the scan chain with undetermined states for scan cells in the scan chain according to embodiments of the present invention.

For further explanation, FIG. 12 sets forth a use case illustrating an exemplary method for leak testing a scan chain (218) with undetermined states for scan cells in the scan chain according to embodiments of the present invention. In the example of FIG. 12, the scan chain (218) has directly written data (1204), scanned-in data (1202), and inverted paths (1206). The directly written data is composed of a series of values, with one value per scan cell, which are loaded directly into the scan cells by use of simulator commands. In the present example, the directly written data (1204) is a series of instances of a marker value, an undetermined state of the scan cells, represented as:

X X X X X X X.

In the use case of FIG. 12, scanned-in data (1202) is composed of values scanned into the scan chain through the scan inputs. In the example of FIG. 12, the scanned-in data (1202) is a series of instances of the marker value represented as:

X X X X X X.

In the example of FIG. 12, inverters are present in the scan chain, and therefore inverted paths (1206) exist. An inverted path (1206) occurs when, as data is scanned through the scan chain from the first scan cell in the scan chain to the last scan cell in the scan chain, the data encounters an inverter in the scan chain. The inverted path persists until another inverter is encountered in the scan chain or the data reaches the end of the scan chain. When scanned data enters a scan cell in the inverted path (1206), the value of the data is inverted until it reaches a scan cell not in an inverted path (1206).

In the example of FIG. 12, four examples of combinatorial logic, referred to as 'Case 1' (1210) through 'Case 4' (1216) are connected to the scan cells of the DUT. These four 'cases' are used to explain exemplary ways in which leaks may occur in a scan chain. In Case 1 (1210) of the present example, the output (1220) of a scan cell is connected to a memory element (1224) through a demultiplexer (1222). In Case 1, the address line of the demultiplexer is set to 0, and the scan cell output is on input 1 of the demultiplexer; the demultiplexer therefore is not enabled to demultiplex input from the scan cell to the output of the multiplexer. The no marker value from the scan chain will propagate to memory element (1224). Case 1 therefore presents no leak of scan data outside the scan chain.

In case 2 (1212) of the present example, the output (1226) of a scan cell is connected to a memory element (1230) through an OR gate (1228). While one input for the OR gate is output from a scan cell, the other input for the OR gate is set high. Thus the OR gate's output will always be greater than or equal to 1, and no marker value from the scan chain will propagate to memory element (1230). Case 2 therefore presents no leak of scan data outside the scan chain.

In case 3 (1214) of the present example, the output (1232) of a scan cell is connected to memory element (1234). However, in case 3, the memory element is not activated (Enable=0), and no marker value from the scan chain will propagate to memory element (1234). Case 3 therefore presents no leak of scan data outside the scan chain.

In case 4 (1216) of the present example, the output (1236) of a scan cell is connected to a series of memory elements (1238, 1240, 1242). In case 4, the memory element (1238) is activated (Enable=1), and therefore a marker value from the scan chain may propagate to the memory element. Case 4 therefore does present a leak of scan data outside the scan chain. In the overall example use case of FIG. 12 therefore, because instances of the marker value can propagate to components of the DUT outside the scan chain, scan verification would fail.

Exemplary embodiments of the present invention are described largely in the context of a fully functional computer system for scan verification for a DUT. Readers of skill in the art will recognize, however, that the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of scan verification for a simulated device under test ('DUT'), the DUT having scan chains, scan inputs, and scan outputs, the method comprising:
    verifying correct data entry from the scan inputs of the DUT into the beginning of the scan chain;
    verifying correct propagation of scan data in the scan chain between the scan inputs and the scan outputs;
    verifying correct data output from the end of the scan chain to the scan outputs; and
    leak testing the scan chain with undetermined states for scan cells in the scan chain.

2. The method of claim 1 wherein verifying correct data entry from the scan inputs of the DUT into the beginning of the scan chain further comprises:
    identifying expected values of the beginning of a scan chain for a test pattern, the test pattern comprising a binary value for each scan cell in the beginning of the scan chain;
    scanning the test pattern through the scan inputs into the beginning of the scan chain; and
    comparing the expected values with the contents of the beginning of the scan chain after scanning in the test pattern.

3. The method of claim 1 wherein verifying correct propagation of scan data in the scan chain between the scan inputs and the scan outputs further comprises:
    transforming, in dependence upon locations of inverters in the scan chain, a binary test pattern comprising one binary value for each scan cell in the scan chain;
    loading the transformed test pattern into the scan chain;
    scanning into the scan chain one or more binary values; and
    after scanning in the binary values, comparing values in the scan chain with the transformed test pattern.

4. The method of claim 1 wherein verifying correct data output from the end of the scan chain to the scan outputs further comprises:
    identifying expected values of the output of a scan chain for a test pattern, the test pattern comprising a binary value for each scan cell in the end of the scan chain;
    loading the test pattern directly into the end of the scan chain;
    scanning the test pattern from the end of the scan chain through the scan outputs; and
    comparing actual data values from the scan outputs with the expected values.

5. The method of claim 1 wherein leak testing the scan chain with undetermined states for scan cells in the scan chain further comprises:
    initializing to 1 or 0 all initializable components of the DUT, including the scan chains, except for one scan chain under test;
    loading the entire scan chain under test with a marker value;
    scanning into the beginning of the scan chain a multiplicity of instances of the marker value; and
    determining whether instances of the marker value are propagated to components of the DUT outside the scan chain under test.

6. An apparatus for scan verification for a simulated device under test ('DUT'), the DUT having scan chains, scan inputs, and scan outputs, the apparatus comprising:
    a computer processor;
    a computer memory operatively coupled to the computer processor, the computer memory having disposed within it computer program instructions capable of:
    verifying correct data entry from the scan inputs of the DUT into the beginning of the scan chain;
    verifying correct propagation of scan data in the scan chain between the scan inputs and the scan outputs;
    verifying correct data output from the end of the scan chain to the scan outputs; and
    leak testing the scan chain with undetermined states for scan cells in the scan chain.

7. The apparatus of claim 6 wherein verifying correct data entry from the scan inputs of the DUT into the beginning of the scan chain further comprises:
    identifying expected values of the beginning of a scan chain for a test pattern, the test pattern comprising a binary value for each scan cell in the beginning of the scan chain;
    scanning the test pattern through the scan inputs into the beginning of the scan chain; and
    comparing the expected values with the contents of the beginning of the scan chain after scanning in the test pattern.

8. The apparatus of claim 6 wherein verifying correct propagation of scan data in the scan chain between the scan inputs and the scan outputs further comprises:
    transforming, in dependence upon locations of inverters in the scan chain, a binary test pattern comprising one binary value for each scan cell in the scan chain;
    loading the transformed test pattern into the scan chain;
    scanning into the scan chain one or more binary values;
    after scanning in the binary values, comparing values in the scan chain with the transformed test pattern.

9. The apparatus of claim 6 wherein verifying correct data output from the end of the scan chain to the scan outputs further comprises:
    identifying expected values of the output of a scan chain for a test pattern, the test pattern comprising a binary value for each scan cell in the end of the scan chain;
    loading the test pattern directly into the end of the scan chain;
    scanning the test pattern from the end of the scan chain through the scan outputs; and
    comparing actual data values from the scan outputs with the expected values.

10. The apparatus of claim 6 wherein leak testing the scan chain with undetermined states for scan cells in the scan chain further comprises:
- initializing to 1 or 0 all initializable components of the DUT, including the scan chains, except for one scan chain under test;
- loading the entire scan chain under test with a marker value;
- scanning into the beginning of the scan chain a multiplicity of instances of the marker value; and
- determining whether instances of the marker value are propagated to components of the DUT outside the scan chain under test.

11. A computer program product for scan verification for a simulated device under test ('DUT'), the DUT having scan chains, scan inputs, and scan outputs, the computer program product disposed upon a signal bearing medium, the computer program product comprising computer program instructions capable of:
- verifying correct data entry from the scan inputs of the DUT into the beginning of the scan chain;
- verifying correct propagation of scan data in the scan chain between the scan inputs and the scan outputs;
- verifying correct data output from the end of the scan chain to the scan outputs; and
- leak testing the scan chain with undetermined states for scan cells in the scan chain.

12. The computer program product of claim 11 wherein the signal bearing medium comprises a recordable medium.

13. The computer program product of claim 11 wherein the signal bearing medium comprises a transmission medium.

14. The computer program product of claim 11 wherein verifying correct data entry from the scan inputs of the DUT into the beginning of the scan chain further comprises:
- identifying expected values of the beginning of a scan chain for a test pattern, the test pattern comprising a binary value for each scan cell in the beginning of the scan chain;
- scanning the test pattern through the scan inputs into the beginning of the scan chain; and
- comparing the expected values with the contents of the beginning of the scan chain after scanning in the test pattern.

15. The computer program product of claim 11 wherein verifying correct propagation of scan data in the scan chain between the scan inputs and the scan outputs further comprises:
- transforming, in dependence upon locations of inverters in the scan chain, a binary test pattern comprising one binary value for each scan cell in the scan chain;
- loading the transformed test pattern into the scan chain;
- scanning into the scan chain one or more binary values; and
- after scanning in the binary values, comparing values in the scan chain with the transformed test pattern.

16. The computer program product of claim 11 wherein verifying correct data output from the end of the scan chain to the scan outputs further comprises:
- identifying expected values of the output of a scan chain for a test pattern, the test pattern comprising a binary value for each scan cell in the end of the scan chain;
- loading the test pattern directly into the end of the scan chain;
- scanning the test pattern from the end of the scan chain through the scan outputs; and
- comparing actual data values from the scan outputs with the expected values.

17. The computer program product of claim 11 wherein leak testing the scan chain with undetermined states for scan cells in the scan chain further comprises:
- initializing to 1 or 0 all initializable components of the DUT, including the scan chains, except for one scan chain under test;
- loading the entire scan chain under test with a marker value;
- scanning into the beginning of the scan chain a multiplicity of instances of the marker value; and
- determining whether instances of the marker value are propagated to components of the DUT outside the scan chain under test.

* * * * *